(12) United States Patent
Zhang et al.

(10) Patent No.: US 6,713,330 B1
(45) Date of Patent: *Mar. 30, 2004

(54) METHOD OF FABRICATING A THIN FILM TRANSISTOR

(75) Inventors: Hongyong Zhang, Kanagawa (JP); Satoshi Teramoto, Kanagawa (JP)

(73) Assignee: Semiconductor Energy Laboratory Co., Ltd., Kanagawa-ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/897,359

(22) Filed: Jul. 21, 1997

Related U.S. Application Data

(60) Continuation of application No. 08/460,210, filed on Jun. 2, 1995, now abandoned, which is a division of application No. 08/260,413, filed on Jun. 14, 1994, now Pat. No. 5,488,000.

(30) Foreign Application Priority Data

Jun. 22, 1993 (JP) ............................................. 5-174736
Jun. 25, 1993 (JP) ............................................. 5-180754

(51) Int. Cl.$^7$ ........................................... H01L 21/336
(52) U.S. Cl. ..................... 438/166; 438/486; 438/487
(58) Field of Search ................. 438/166, 486, 438/487, 795, 30

(56) References Cited

U.S. PATENT DOCUMENTS

| | | |
|---|---|---|
| RE28,385 E | 4/1975 | Mayer et al. |
| RE28,386 E | 4/1975 | Heiman et al. |
| 4,226,898 A | 10/1980 | Ovshinsky et al. |
| 4,231,809 A | 11/1980 | Schmidt |
| 4,300,989 A | 11/1981 | Chang |
| 4,309,224 A | 1/1982 | Shibata |
| 4,331,709 A | 5/1982 | Risch et al. |
| 4,379,020 A | 4/1983 | Glaeser et al. |
| 4,482,395 A | 11/1984 | Hiramoto |
| 4,561,171 A | 12/1985 | Schlosser |
| 4,727,044 A * | 2/1988 | Yamazaki |
| 5,043,224 A | 8/1991 | Jaccodine et al. |
| 5,145,808 A | 9/1992 | Sameshima et al. |
| 5,147,826 A | 9/1992 | Liu et al. ..................... 437/233 |
| 5,200,630 A | 4/1993 | Nakamura et al. |
| 5,221,423 A | 6/1993 | Sugino et al. |
| 5,225,355 A | 7/1993 | Sugino et al. |
| 5,244,819 A | 9/1993 | Yue |
| 5,248,630 A | 9/1993 | Serikawa et al. |

(List continued on next page.)

FOREIGN PATENT DOCUMENTS

| | | |
|---|---|---|
| EP | 0 178 447 | 4/1986 |
| EP | 0 390 608 A2 | 10/1990 |
| JP | 57-194518 | 11/1982 |

(List continued on next page.)

OTHER PUBLICATIONS

Bonnel et al., Polycrystalline Silicon Thin–Film Transistors with Two–Step Annealing Process, IEEE Electron Device Letters, vol. 14, No. 12, Dec. 1993, pp. 551–553.*

(List continued on next page.)

*Primary Examiner*—Mary Wilczewski
(74) *Attorney, Agent, or Firm*—Eric J. Robinson; Robinson Intellectual Property Law Office, P.C.

(57) ABSTRACT

Method of fabricating TFTs starts with forming a nickel film selectively on a bottom layer which is formed on a substrate. An amorphous silicon film is formed on the nickel film and heated to crystallize it. The crystallized film is irradiated with infrared light to anneal it. Thus, a crystalline silicon film having excellent crystallinity is obtained. TFTs are built, using this crystalline silicon film.

26 Claims, 10 Drawing Sheets

U.S. PATENT DOCUMENTS

| | | | |
|---|---|---|---|
| 5,254,480 A | | 10/1993 | Tran |
| 5,262,350 A | | 11/1993 | Yamazaki et al. |
| 5,262,654 A | | 11/1993 | Yamazaki |
| 5,275,851 A | | 1/1994 | Fonash et al. ............... 427/578 |
| 5,296,405 A | | 3/1994 | Yamazaki et al. |
| 5,298,075 A | | 3/1994 | Lagendijk et al. |
| 5,300,187 A | | 4/1994 | Lesk et al. |
| 5,308,998 A | | 5/1994 | Yamazaki et al. |
| 5,313,075 A | | 5/1994 | Zhang et al. |
| 5,313,076 A | * | 5/1994 | Yamazaki et al. ............ 257/66 |
| 5,318,661 A | | 6/1994 | Kumomi ........................ 117/8 |
| 5,352,291 A | | 10/1994 | Zhang et al. |
| 5,366,926 A | | 11/1994 | Mei et al. |
| 5,395,804 A | | 3/1995 | Ueda |
| 5,403,772 A | | 4/1995 | Zhang et al. ................. 437/51 |
| 5,424,230 A | | 6/1995 | Wakai |
| 5,426,064 A | | 6/1995 | Zhang et al. ......... 437/40 TFT |
| 5,488,000 A | | 1/1996 | Zhang et al. |
| 5,492,843 A | | 2/1996 | Adachi et al. |
| 5,529,937 A | | 6/1996 | Zhang et al. |
| 5,531,182 A | | 7/1996 | Yonehara |
| 5,545,571 A | * | 8/1996 | Yamazaki et al. |
| 5,550,070 A | | 8/1996 | Funai et al. |
| 5,572,047 A | * | 11/1996 | Hiroki et al. ................. 257/72 |
| 5,639,698 A | | 6/1997 | Yamazaki et al. |
| 5,648,662 A | * | 7/1997 | Zhang et al. ................. 257/59 |
| 5,681,759 A | | 10/1997 | Zhang |
| 5,753,542 A | * | 5/1998 | Yamazaki et al. .......... 438/162 |
| 5,766,344 A | * | 6/1998 | Zhang et al. ............... 117/103 |
| 5,773,327 A | | 6/1998 | Yamazaki et al. |
| 5,783,468 A | | 7/1998 | Zhang et al. |
| 5,804,471 A | | 9/1998 | Yamazaki et al. |
| 5,808,321 A | | 9/1998 | Mitanaga et al. |
| 5,830,784 A | | 11/1998 | Zhang et al. |
| 5,843,225 A | | 12/1998 | Takayama et al. |
| 5,879,977 A | | 3/1999 | Zhang et al. |
| 5,897,347 A | | 4/1999 | Yamazaki et al. |
| 5,923,997 A | | 7/1999 | Mitanaga et al. |
| 5,946,561 A | * | 8/1999 | Yamazaki et al. .......... 438/166 |
| 5,956,579 A | | 9/1999 | Yamazaki et al. |
| 5,985,704 A | | 11/1999 | Adachi et al. |
| 5,994,172 A | | 11/1999 | Ohtani et al. |
| 6,278,093 B1 | * | 8/2001 | Yonehara .................... 437/173 |

FOREIGN PATENT DOCUMENTS

| | | |
|---|---|---|
| JP | 58-40820 | 3/1983 |
| JP | 60-105216 | 6/1985 |
| JP | 61-063017 | 4/1986 |
| JP | 61-078120 | 4/1986 |
| JP | 61-116820 | 6/1986 |
| JP | 62-298151 | 12/1987 |
| JP | 63-211759 | 9/1988 |
| JP | 01-187814 | 7/1989 |
| JP | 01-187875 | 7/1989 |
| JP | 2-140915 | 5/1990 |
| JP | 03-029316 | 2/1991 |
| JP | 03-284831 | 12/1991 |
| JP | 04-091425 | 3/1992 |
| JP | 05-082442 | 4/1993 |
| JP | 05-109737 | 4/1993 |

OTHER PUBLICATIONS

Nam et al., Thin Film Transistors with Polycrystalline Silicon Prepared by a New Annealing Technigue, Jpn. J. Appl. Phys., vol. 32, 1993, pp. 1908–1912.*

Wolf et al., Silicon Processing for the VLSI Era,, vol. 2—Process Integration, Sunset Beach, CA: Lattice Press, 1990, pp. 154–155 and 333–334.*

Takenaka et al., "High Mobility Poly–Si Thin Film Transistors Using Solid Phase Crystallized a–SI Films Deposited by Plasma–Enhanced Chemical Vapor Deposition", Dec. 1990, 2380–2383, Jap. J of Appl Phys., vol. 29, No. 12.

Green et al., "Method to Purify Semiconductor Wafers", Oct. 1973, 1612–1613, IBM Technical Disclosure Bulletin, vol. 16, No. 5.

Hayzelden et al., "Silicide Formation and Silicide–Mediated Crystallization of Nickel–Implanted Amorphous Silicon Thin Films", Jun. 15, 1993, 8279–8289, J. Appl. Phys. 73(12).

Kuznetsov et al., "Silicide Precipitate Formation and Soild Phase Regrowth of Ni–Implanted Amorphous Silicon", Apr. 5–8–1993, 191–194, Institute of Physics Conference Series No. 134.

Erokhin et al., "Spatially Confined Nickel Disilicide Formation at 400C on Ion Implantation Preamorphized Silicon", Dec. 6, 1993, 3173–3175, Appl. Phys. Lett. 63 (23).

Batstone et al., "Microscopic Processes in Crystallisation", 1994, 257–268, Solid State Phenomena Vols. 37–38.

Cammarata et al., "Silicide Precipitation and Silicon Crystallization in Nickel Implanted Amorphous Silicon Thin Films", Oct. 10, 1990, 2133–2139, J. Mater. Res., vol. 5, No. 10.

Bruines et al., "Between Explosive Crystallization and Amorphous Regrowth: Inhomogeneous Solidification upon Pulsed–Laser Annealing of Amorphous Silicon", Mar. 1987, (3 pages), Applied Physics Letters.

Stoemenos et al., "Crystallization of Amorphous Silicon by Reconstructive Transformation Utilizing Gold", Mar. 18, 1991, 1196–1998, Appl. Phys. Lett. 58(11).

Kuznetsov et al., "Enchanced Solid Phase Epitaxial Recrystallization of Amorphous Silicon Due to Nickel Silicide Precipitation Resulting from Ion Implantation and Annealing", 1993, 990–993, Nuclear Instruments and Methods in Physics Research.

Kawazu et al., "Low Temperature Crystallization of Hydrogenated Amorphous Silicon Induced by Nickel Silicide Formation", Jap. J. of Appl. Phys., vol. 29, No. 12, Dec. 1990, pp. 2692–2704.

Kawazu et al., "Initial Stage of the Interfacial Reaction between Nickel and Hydrogenated Amorphous Silicon", Jap. J. of Appl. Phys.; vol. 29, No. 4, Apr. 1990, pp. 729–738.

"Crystallized Si Films By Low–Temperature Rapid Thermal Annealing Of Amorphous Silicon", R. Kakkad, J. Smith, W.S. Lau, S.J. Fonash, J. Appl. Phys. 65 (5), Mar. 1, 1989, 1989 American Institute of Physics, p. 2069–2072.

"Polycrystalline Silicon Thin Film Transistors on Corning 7059 Glass Substrates Using Short Time, Low Temperature Processing", G. Liu, S.J. Fonash, Appl. Phys. Lett. 62 (20), May 17, 1993, 1993 American Institute of Physics, p. 2554–2556.

"Selective Area Crystallization of Amorphous Silicon Films by Low–Temperature Rapid Thermal Annealing", Gang Liu and S.J, Fonash, Appl. Phys. Lett. 55 (7), Aug. 14, 1989, 1989 American Institute of Physics, p. 660–662.

"Low–Temperature Selective Crystallization of Amorphous Silicon", R. Kakkad, G. Liu, S.J. Fonash, Journal of Non–Crystalline Solids, vol. 115, (1989), p. 66–68.

C. Hayzelden et al., "In Situ Transmission Electron Microscopy Studies of Silicide–Mediated Crystallization of Amorphous Silicon" (3 pages).

A.V. Dvurechenskii et al., "Transport Phenomena in Amorphous Silicon Doped by Ion Implantation of 3d Metals", Akademikian Lavrentev Prospekt 13, 630090 Novosibirsk 90, USSR, pp. 635–640.

T. Hempel et al., "Needle–Like Crystallization of Ni Doped Amorphous Silicon Thin Films", Solid State Communications, vol. 85, No. 11, pp. 921–924, 1993.

* cited by examiner

METHOD OF FABRICATING A THIN FILM TRANSISTOR

This application is a Continuation of Ser. No. 08/460,210, filed Jun. 2, 1995, now abandoned; which itself is a division of Ser. No. 08/260,413, filed Jun. 14, 1994 (now U.S. Pat. No. 5,488,000).

FIELD OF THE INVENTION

The present invention relates to a semiconductor device having thin-film transistors (TFTs) formed on an insulating substrate made of glass or the like and also to a method of fabricating such a semiconductor device.

BACKGROUND OF THE INVENTION

Known semiconductor devices having TFTs on an insulating substrate made of glass or the like include active-matrix liquid-crystal displays and image sensors which use such TFTs to activate pixels.

Generally, TFTs used in these devices are made of a silicon semiconductor in the form of a thin film. Silicon semi-conductors in the form of a thin film are roughly classified into amorphous silicon semiconductors (a-Si) and crystalline silicon semiconductors. Amorphous silicon semi-conductors are fabricated at low temperatures. In addition, they are relatively easy to manufacture by chemical vapor deposition. Furthermore, they can be easily mass-produced. Therefore, amorphous silicon semiconductors have enjoyed the widest acceptance. However, their physical properties such as conductivity are inferior to those of crystalline silicon semiconductors. In order to obtain higher-speed characteristics from amorphous silicon semiconductors, a method of fabricating TFTs consisting of a crystalline silicon semiconductor must be established and has been keenly sought for. It is known that crystalline silicon semiconductors include polysilicon, silicon crystallites, amorphous silicon containing crystalline components, and semi-amorphous silicon that is midway in nature between crystalline state and amorphous state.

Known methods of obtaining these crystalline thin-film silicon semiconductors include:

(1) During fabrication, a crystalline film is directly created.

(2) An amorphous semiconductor film is once formed. Then, the film is irradiated with laser light so that the energy of the laser light imparts crystallinity to the film.

(3) An amorphous semiconductor film is once formed. Thermal energy is applied to the film to crystallize it.

Where the method (1) above is utilized, it is technically difficult to form a semiconductor film having good physical properties over the whole surface uniformly. Also, the film is formed at a high temperature of over 600° C. and so cheap glass substrates cannot be used. Hence, this method presents problems regarding costs.

In the method (2), an excimer laser is used most commonly today. If this excimer laser is employed, the laser light illuminates only a small area and hence the throughput is low. Furthermore, the stability of the laser is not stable enough to uniformly process the whole surface of a large-area substrate. Therefore, we feel that this method is a technique of the next generation.

The method (3) above can process substrates of larger areas compared with the methods (1) and (2). However, a high temperature exceeding 600° C. is also necessary. It is necessary to lower the heating temperature where cheap glass substrates are used. Especially, liquid crystal displays having larger areas have tended to be manufactured today. With this trend, larger glass substrates have to be employed. Where larger glass substrates are used in this way, shrinkage and stress produced during a heating step that is essential for semiconductor fabrication deteriorate the accuracies of mask alignment and other steps. This presents serious problems. Especially, in the case of Corning 7059 which is most commonly used today, the strain point is 593° C. Therefore, if the prior art heating-and-crystallization step is effected, a large distortion is induced. Besides the problem of temperature, the heating time, i.e., the time required for crystallization, poses problems. In particular, the heating time necessary for crystallization is as long as tens of hours or longer in the present process. Therefore, it is necessary to shorten the heating time.

SUMMARY OF THE INVENTION

It is an object of the present invention to provide means for solving the foregoing problems.

It is a more specific object of the invention to provide a method of fabricating a thin film of crystalline silicon semiconductor by forming a thin film of amorphous silicon and heating this film at a lower temperature and in a shorter time than heretofore to crystallize it.

Of course, a crystalline silicon semiconductor fabricated by the manufacturing process according to the invention has physical properties comparable or superior to the physical properties of crystalline silicon semiconductor devices fabricated by the prior art techniques and can be used in active layer regions of TFTs.

We formed amorphous silicon semiconductor films as described above by CVD processes and sputtering processes. These films were heated to crystallize them. We conducted experiments on this method of heating amorphous silicon semiconductor films and discussed the method as follows.

As an experiment, an amorphous silicon film was formed on a glass substrate. This film was crystallized by heating. We discussed the mechanism by which the film was heated and crystallized. Crystals began to grow at the interface between the glass substrate and the amorphous silicon. We observed that where a given film thickness was exceeded, the crystals grew like columns vertical to the substrate surface.

We understand the above-described phenomenon as follows. Crystal nuclei, or seed crystals, exist at the interface between the glass substrate and the amorphous silicon film, and crystals grow from these nuclei. We consider that these crystal nuclei are trace amounts of impurity metal elements existing on the surface of the substrate and the crystalline component of the glass surface. It is considered that crystalline component of silicon oxide (known as crystallized glass) is present on the surface of the glass surface.

Accordingly, we have thought that the crystallization temperature might be lowered by introducing crystal nuclei more positively. To confirm the effects of this temperature drop, we conducted an experiment. That is, a trace amount of other metal was deposited on a substrate. A thin film of amorphous silicon was formed on the metal layer. Then, the amorphous silicon was heated and crystallized. Where some metals are deposited on the substrate, crystallization temperature drop was confirmed. We imagined that crystals were growing from crystal nuclei of foreign substances. We further investigated the mechanism on plural impurity metals which permitted temperature decreases.

A crystallization process can be classified into two phases, i.e., creation of nuclei at the initial stage and crystal growth from the nuclei. The speed of the creation of nuclei at the initial stage can be known by measuring the time taken until microscopic dot-like crystals are created at a constant temperature. Where any of the above-described impurity metals was deposited as a thin film, the time was shortened. This demonstrates that introduction of crystal nuclei lowers the crystallization temperature. We discovered an unforeseen fact. Specifically, the growth of crystal grains subsequent to nucleation was investigated while varying the heating time. Where some metal was deposited as a film and then a thin film of amorphous silicon formed on the metal film was crystallized, crystals grew at an amazing rate after the nucleation. The mechanism of this phenomenon will be described in greater detail later.

In any case, we have discovered that if a trace amount of some metal is deposited as a film, a thin film of amorphous silicon is formed on the metal film, and then the amorphous silicon film is heated and crystallized, then sufficient crystallization is caused by the above-described two effects at a temperature lower than 580° C. in a time of about 4 hours, which would have never been conceived heretofore. The material which showed the most conspicuous effects and we have selected out of impurity metals exhibiting such effects is nickel.

We now give examples of structure, illustrating the effect of nickel. A substrate made of Corning 7059 was not treated at all. That is, a thin film consisting of a trace amount of nickel was not formed on the substrate. A thin film of amorphous silicon was formed on the substrate by plasma CVD. This thin film was heated in a nitrogen ambient to crystallize the film. Where the heating temperature was 600° C., the required heating time was 10 hours or longer. Where a thin film consisting of a trace amount of nickel was formed on the substrate, similar crystallization was induced by heating the thin film of amorphous silicon for about 4 hours. The crystallization was investigated by Raman spectroscopy. This demonstrates that the nickel produces very great effects.

As can be understood from the above description, where a thin film of amorphous silicon is formed on a thin film consisting of a trace amount of nickel, the crystallization temperature can be lowered. Also, the crystallization time can be shortened. It is assumed that this process is applied to fabrication of TFTs. We now describe the process in further detail.

Methods of implementing the addition of traces of nickel are first described. In a first method, a thin film is formed out of a trace amount of nickel on a substrate and then a film of an amorphous silicon is formed. In a second method, a film of amorphous silicon is first formed and then a thin film is formed out of a trace amount of nickel on the amorphous silicon film. Both methods can lower the temperature similarly. We have found that films can be formed by either sputtering or evaporation. That is, the process does not depend on the method of forming the films. Where a trace amount of nickel is deposited as a thin film on a substrate, a method consisting of forming a thin film of silicon oxide on a glass substrate of Corning 7059 and forming a thin nickel film out of a trace amount of nickel on the silicon oxide film produces greater effects than does a method of directly depositing a trace amount of nickel as a thin film on the substrate. We consider that the fact that silicon and nickel are in direct contact with each other is important for the temperature decrease, and that in the case of Corning 7059, components other than silicon may impede contact between silicon and nickel or reaction between them.

One method of adding a trace amount of nickel is to form a thin film in contact with the top or bottom surface of an amorphous silicon layer. We have confirmed that similar effects are produced where nickel is added by ion implantation, and that where the dopant concentration of nickel was in excess of $1\times10^{15}$ atoms/cm$^3$, the temperature was lowered. Where the dopant concentration was greater than $1\times10^{21}$ atoms/cm$^3$, the shape of the peak of the obtained Raman spectrum was distinctly different from the shape of the peak of the Raman spectrum obtained from a single substance of silicon. Therefore, we consider that the usable dopant concentration range is between $1\times10^{15}$ and $5\times10^{19}$ atoms/cm$^3$. Where the thin film is used as the active layers of TFTs, taking account of the physical properties of the semiconductor, it is necessary to restrict the dopant concentration to the range from $1\times10^{15}$ to $1\times10^{19}$ atoms/cm$^3$. The growth of crystals to which a trace amount of nickel is added and the features of the crystal morphology are described next. Also, the crystallizing mechanism estimated from these features is described.

Where nickel is not added, nuclei are created at random from crystal nuclei existing at the interface with the substrate. Also, crystals grow at random from the nuclei. It has been reported that crystals relatively well oriented in a (110) or (111) direction are obtained, depending on the method of fabrication. Of course, a substantially uniform crystal growth is observed over the whole thin film.

In order to confirm this mechanism, we made an analysis, using a differential scanning calorimeter (DSC). A thin film of amorphous silicon was formed on a substrate by plasma-assisted chemical vapor deposition (PCVD). The thin film was loaded into a container together with the substrate. The temperature was elevated at a constant rate. A clear heat-generating peak was observed in the neighborhood of 700° C. Of course, this temperature was shifted with the temperature elevation rate. Where the rate was 10° C./min, crystallization started at 700.9° C. Then, measurements were made with three different temperature elevation rates. The activation energy for crystal growth after initial nucleation was found by the Ozawa's method. The energy was about 3.04 eV. The reaction rate formula was compared with the theoretical curve to determine whether the formula fitted the curve. We have found that random creation of nuclei and its growth model can account for the activation energy best. This proves the validity of the theory that seed crystals are created at random from crystal nuclei existing at the interface with the substrate and then crystals grow from the nuclei.

Similar measurements were made except that a trace amount of nickel was added. Where the temperature was elevated at a rate of 10° C./min, crystallization was started at 619.9° C. The activation energy for crystal growth found from a series of measurements was approximately 1.87 eV. This numerical value demonstrates that crystal growth is promoted. The reaction rate formula found by the comparison with the theoretical curve approximated the one-dimensional interface reaction rate rule model. This suggests that crystals are grown in a certain direction. The data obtained from the above-described thermal analysis is listed in Table 1 below. The activation energy given in this Table 1 was found by measuring the quantity of heat released from each sample during heating of the sample and calculating the energy from the quantity of heat by analyzing means called the Ozawa's method.

TABLE 1

| crystallization percentage | activation energy (eV) nickel is added | nickel is not added |
|---|---|---|
| 10% | 2.04 | 2.69 |
| 30% | 1.87 | 2.90 |
| 50% | 1.82 | 3.06 |
| 70% | 1.81 | 3.21 |
| 90% | 1.83 | 3.34 |
| average | 1.87 | 3.04 |

The activation energy given in Table 1 above is a parameter indicating the degree of easiness of crystallization. As the value of the activation energy is increased, it is more difficult to induce crystallization. Conversely, as the value is reduced, it is easier to induce crystallization. It can be seen from Table 1 that the activation energy of each sample containing nickel drops as crystallization progresses. That is, as crystallization progresses, crystallization is caused more easily. In the case of a crystalline silicon film formed by the prior art method without adding nickel, as crystallization progresses, the activation energy is increased. This indicates that as crystallization proceeds, it is more difficult to induce crystallization. Comparison of the average values of activation energy reveals that the value of the silicon film crystallized with addition of nickel is about 62% of the value of the silicon film crystallized without adding nickel. This indicates that an amorphous silicon film doped with nickel can be easily crystallized.

The morphologies of crystals to which nickel was added were observed with a transmission electron microscope. The results of the observation show that a region doped with nickel differs in crystal growth from adjacent regions. Specifically, a cross section of the nickel-doped region was observed. Moire fringes or other fringes which seemed to be a lattice image were substantially vertical to the substrate. We consider that the added nickel or its compound with silicon forms crystal nuclei which induced growth of columnar crystals substantially vertical to the substrate, in the same way as in the case where no nickel is added. In regions surrounding the nickel-doped region, crystals were observed to have grown like styli or columns parallel to the substrate.

The morphologies of crystals close to the nickel-doped regions were observed. First of all it was not expected that regions to which the trace amount of nickel was not directly added were crystallized. The concentrations of nickel in the region to which the trace amount of nickel was added, in lateral crystal growth regions close to the nickel-doped region, and in remoter amorphous regions were measured by secondary ion mass spectrometry (SIMS). At locations considerably remote from the nickel-doped region, low-temperature crystallization did not take place, and an amorphous region remained. As shown in FIG. 4, the nickel concentration in the lateral crystal growth regions was lower than the concentration in the nickel-doped region. The concentration in the amorphous regions was still lower by about 1 order of magnitude. That is, nickel atoms were diffused over a considerably broad region. In particular, the nickel concentration is high in the region in which nickel has been directly added. The lateral growth portion (the portion in which the crystal has grown parallel to the substrate) has a lower nickel concentration than the region in which nickel has been directly added.

It was observed from the TEM image of a surface close to the nickel-doped region that the greatest lateral crystals parallel to the substrate grew as long as hundreds of micrometers from the nickel-doped region, and that the amount of growth increases with the lapse of time and with elevating the temperature. As an example, growth of about 20 $\mu$m was observed in a process conducted at 550° C. for 4 hours. It was confirmed that this crystal growth proceeded in the form of stylus or column, and that the terminal portion (the front end) of the crystal growth contains nickel concentratedly. Spacial distribution of Ni was measured by EDX concerning columnar crystal which is characteristic of lateral growth, and examined correlation between the distribution and the columnar crystal. EDX measurement of the front end of Si was carried out. The result is shown in FIG. 10(A). FIG. 10(B) shows a measurement of a film containing no Ni for reference, and it can be considered that FIG. 10(B) indicates the lower limit of detection. Comparison of these two indicates that the front end contains a large amount of Ni.

The results of the experiments obtained as described above has led us to consider that crystallization progresses by the mechanism described now. First, crystal nuclei are created. The activation energy is reduced by the addition of a trace amount of nickel because the addition of nickel enables crystallization at lower temperatures. We consider that one reason is that nickel acts as a foreign substance. Another reason might arise from the fact that one of nickel-silicon intermetallic compounds has a lattice constant close to that of crystalline silicon. Every nucleation occurs almost simultaneously over the whole surface of the nickel-doped region. As a result, crystals grow while maintaining planes. In this case, the reaction rate formula is given by a one-dimensional interface reaction rate rule process. Thus, columnar crystals substantially vertical to the substrate are obtained. However, completely aligned crystallographic axes cannot be derived because of the restriction imposed by the film thickness and because of the effects of stress or the like.

The crystal components parallel to the substrate are more uniform than components vertical to the substrate. Therefore, column- or stylus-like crystals grow uniformly laterally around crystal nuclei created in the nickel-doped region. Of course, it is expected that the reaction rate formula is given by a one-dimensional interface reaction rate rule process. Since the activation energy for crystal growth is reduced by the addition of nickel as described previously, it is expected that the lateral growth rate is very high and in fact this is true.

The electrical characteristics of the nickel-doped region and of the nearby lateral growth regions are described next. Of the electrical characteristics of the nickel-doped region, the conductivity is approximate to that of a film to which almost no nickel is added. This film was crystallized at about 600° C. for tens of hours. The activation energy was found from the temperature-dependence of the conductivity. Where the nickel concentration was $10^{17}$ to $10^{18}$ atoms/cm$^3$, any behavior which seems to be contributable to the energy levels of nickel was not observed. That is, these experimental results have led us to consider that the nickel-doped region can be used as the active layers of TFTs if this region has above-described concentration. The experimental results are shown in FIG. 9. The sample used in the experiment is prepared as follows. Corning 7059 glass is used for substrate. SiO$_2$ base 2000 Å film is formed by sputtering on the glass. Then an amorphous silicon film is formed with SiH$_4$/H$_2$ mixed gas by CVD, and thereafter a small quantity of Ni is added by plasma treatment utilizing Ni electrode. The treatment conditions are as follows.

| | |
|---|---|
| Reaction gas | Ar/H$_2$ = 25/50 sccm |
| Reaction pressure | 10 Pa |
| Substrate temperature | 300° C. |
| RF-power | 20 W |
| treatment time | 5 min. |

Thermal crystallization was carried out at between 450° C. and 700° C. after 1 hour hydrogen extraction at 430° C. The atmosphere in which crystallization was carried out was nitrogen atmosphere. Nitrogen flowed in and out. We examined electric characteristics (conductivity) of crystalline silicon semiconductor by measuring temperature dependency which was measured on electric current and voltage by coplanar-type Al electrode which was formed on the silicon film. Activation energy of FIG. 9 is obtained from the conductivity. It can be said that the value of activation energy is appropriate as crystalline silicon semiconductor as far as our experiments are concerned, and effects on electric characteristics (conductivity) by the energy levels of Ni are very small at least when measured at around normal temperature.

On the other hand, the conductivity of the lateral growth portions is higher than that of the nickel-doped region by at least one order of magnitude and is comparatively high for a crystalline silicon semiconductor. Since the direction of flow of electrical current agrees with the direction of lateral crystal growth, we consider that grain boundaries to hinder the movement of electrons do not or hardly exist between the electrodes. This agrees well with the results of the TEM images. That is, carriers are moved along the grain boundaries of crystals grown like styli or columns and so the carriers easily move.

We have confirmed that the front ends of crystals grown like styli or columns have a high nickel concentration similarly to the nickel-doped region. We estimate from this that where devices such as TFTs are fabricated, using these heavily doped regions, the operation of the devices is affected by the nickel. Therefore, neither the starting points of crystals of the crystalline silicon film grown parallel to the substrate nor the end points of the crystal growth are used. It is advantageous to use only the intermediate regions.

Accordingly, in the present invention, as shown in FIGS. 1, (A)–(D), an amorphous silicon film 13 to be crystallized and an overlying silicon oxide film 14 are patterned into islands. A film 15 containing a trace amount of an element such as nickel silicide is formed on the islands. Nickel silicide is formed on the side surfaces 16 of the amorphous silicon film 13. Crystals are caused to grow from these side surfaces as indicated by the arrows 17. Devices such as TFTs are fabricated without using regions 10 and 18 heavily doped with nickel.

That is, neither the starting points of crystals of the crystalline silicon film grown parallel to the substrate nor the end points, or the front end portions, of the crystal growth are used. The intermediate portions are employed, and a crystalline silicon film in which carriers move easily is used. At the same time, regions lightly doped with nickel are used. More specifically, regions lightly doped with nickel can be used by removing (e.g., etching) the regions doped with the metal element for promoting crystallization and the finally grown portions parallel to the substrate after the crystallization.

It is important that the novel crystalline silicon film on a substrate be not a single crystal of silicon. The invention is characterized in that the film is a crystalline silicon film crystallized in the form of a thin film and that the direction of the crystal growth is parallel to the substrate. This film is essentially different from a single crystal of silicon. Therefore, the novel crystalline silicon film can be referred to as a non-single crystal crystalline silicon film.

Elements for promoting crystallization in accordance with the present invention can be selected from the elements belonging to group VIII of the periodic table, i.e., Fe, Co, Ni, Ru, Rh, Pd, Os, Ir, and Pt. Also, transition elements Sc, Ti, V, Cr, Mn, Cu, and Zn can be used. Experiments show that Au and Ag promote crystallization. Ni produces especially conspicuous effects among the elements described above. We have confirmed that a silicon film crystallized by the action of Ni is used to fabricate TFTs and that these TFTs operate successfully.

Metal atoms for promoting crystallization are concentrated at the front ends of crystals grown parallel to the substrate. Devices are fabricated in regions located between these front ends and the starting point of growth to which the metal element has been added. Thus, the carriers can be moved at a high speed. At the same time, the concentration of metal elements which are considered to adversely affect movement of the carriers is reduced. Hence, devices having excellent characteristics are obtained.

In another feature of the invention, a non-single crystal semiconductor film (e.g. a silicon film) formed on a substrate is crystallized by heating the film below 600° C. and irradiating the film with intense light to enhance the crystallinity. At the same time, the film is made denser.

In a further feature of the invention, a silicon film (e.g. a non-single crystal silicon film) doped with a metal element such as nickel for promoting crystallization is heated to crystallize the film. Then, the film is irradiated with intense light such as infrared light or laser light (e.g., infrared light having a peak at wavelength 1.3 $\mu$m) to heat and anneal the film. In this way, the crystallinity is improved.

Elements for promoting crystallization in accordance with the present invention can be selected from the elements belonging to group VIII of the periodic table, i.e., Fe, Co, Ni, Ru, Rh, Pd, Os, Ir, and Pt. Also, transition elements Sc, Ti, V, Cr, Mn, Cu, and Zn can be used. Experiments show that Au and Ag promote crystallization. Ni produces especially conspicuous effects among the elements described above. We have confirmed that a silicon film crystallized by the action of Ni is used to fabricate TFTs and that these TFTs operate successfully.

A thin-film silicon semiconductor crystallized by heating below 600° C. is irradiated with infrared light or laser light to selectively heat the silicon film. Also, the crystallinity can be enhanced. At this time, the infrared light is not readily absorbed by the glass substrate and so the annealing can be carried out without heating the glass substrate to a large extent.

Other objects and features of the invention will appear in the course of the description thereof, which follows.

DETAILED DESCRIPTION OF THE INVENTION

EXAMPLE 1

In the present example, a P-channel TFT (PTFT) and an N-channel TFT (NTFT) both using a crystalline silicon film formed on a glass substrate are combined complementarily to build a circuit. The structure of the present example can be applied to switching devices for pixel electrodes of an active-matrix liquid-crystal display, to a peripheral driver circuit thereof, to an image sensor, and to an integrated circuit. Furthermore, devices to which the present example is applied are not restricted to insulated-gate field-effect transistors. They can be other transistors and diodes. The invention is applicable to an integrated circuit comprising these semiconductor devices, resistors, and capacitors.

FIGS. 1, (A)–(D), and 2, (A)–(B), are cross sections of TFTs fabricated according to the present example, illustrating the process sequence. First, silicon oxide was sputtered as a 2000 Å-thick bottom film 12 on a substrate 11 made of Corning 7059. Then, a well-known amorphous silicon film 13 having a thickness of 500–1500 Å (e.g., 500 Å) was formed by plasma-assisted CVD (PCVD). Thereafter, a silicon oxide film 14 having a thickness of 200–2000 Å (e.g., 1000 Å) was formed by sputtering. The lamination of the amorphous silicon film 13 and the silicon oxide film 14 was photolithographically patterned into islands.

Figure 1A:
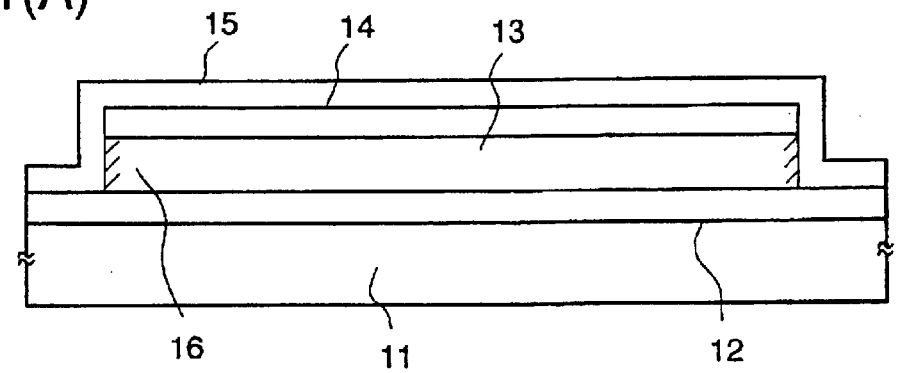
FIGS. 1(A) to 1(D) are cross-sectional views of TFTs illustrating successive steps for fabricating the TFTs according to an embodiment of the invention.
Figure 1B:
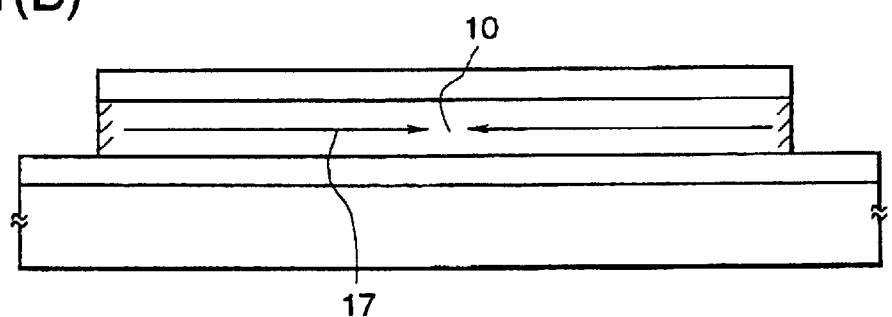

After the step described above, a nickel silicide film 15 having a thickness of 5–200 Å, e.g., 100 Å, was formed by sputtering techniques. The composition of this nickel silicide film 15 is given by a chemical formula $NiSi_x$, where $0.4 \leq x \leq 2.5$ (e.g., x=2.0). It is important that this nickel silicide film be formed on the side surfaces of the amorphous silicon film. This film may also be formed by evaporation, CVD, or plasma processing. In this way, the shape shown in FIG. 1(A) is obtained. Where the metal for promoting crystallization is other than nickel, the thin film 15 may be formed by sputtering, evaporation, plasma processing, or CVD using the metal other than nickel.

Then, the laminate was heated at 300–600° C. (e.g., 450° C.) for 1 hour to form a nickel silicide region 16, followed by removal of the nickel silicide film 15. The amorphous silicon film 13 was annealed at 550° C. for 4 hours in a reducing hydrogen ambient (preferably, the partial pressure of the hydrogen is 0.1 to 1 atm) or in an inert ambient (at atmospheric pressure). At this time, crystals were grown parallel to the substrate 11 as indicated by the arrows 17.

The above-described step may be modified as follows. Thermal annealing is conducted at 550° C. for 4 hours without forming the nickel silicide. Crystals are grown directly from the side surfaces 16 of the amorphous silicon film 13. Then, the nickel silicide film 15 is removed. Where this modified step is adopted, the crystallization is effected simultaneously with the formation of the nickel silicide 16. In this case, however, there is the possibility that nickel atoms are diffused during the thermal annealing.

As a result of the above-described step, the amorphous silicon film was crystallized. Thus, the crystalline silicon film 13 (FIG. 1(C)) could be derived. Thereafter, isotropic etching was carried out to etch the side surfaces 18 of the crystallized silicon film 13 because these portions were made of nickel silicide and contained nickel at a high concentration of over $10^{21}$ atoms/cm$^3$. Removing the nickel silicide regions in this way is very important where devices such as TFTs are fabricated. For example, after this step, an ion implantation step for forming source/drain regions, an activation step for activating the source/drain regions, and other steps are performed. In the above-described step, it is inevitable that heat is applied to the silicon film 13 and so nickel atoms might be diffused out of the nickel-rich region in the silicon film. Especially, where nickel silicide is formed, it is expected that a considerable amount of nickel is diffused out of this nickel silicide region. This will affect the operation of the TFTs. Consequently, removing the nickel suicide region as described above after the crystallization is useful.

Figure 1C:
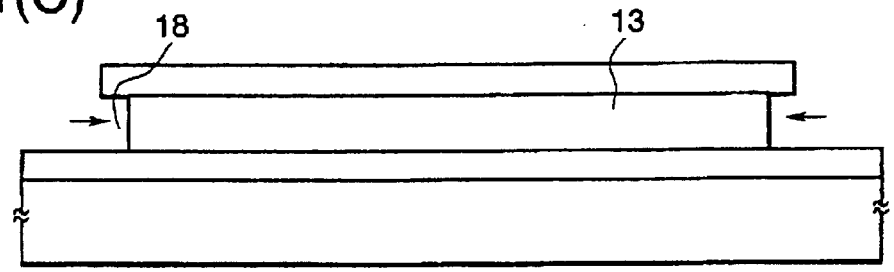

Then, the silicon oxide film 14 was removed, thus obtaining the shape shown in FIG. 1(C). Crystals were grown from both sides and their front ends overlapped each other in the center of the crystallized silicon film 13. Since this central portion is heavily doped with nickel, it is not desired to use this heavily doped region for the channel formation region of a TFT.

Figure 2:
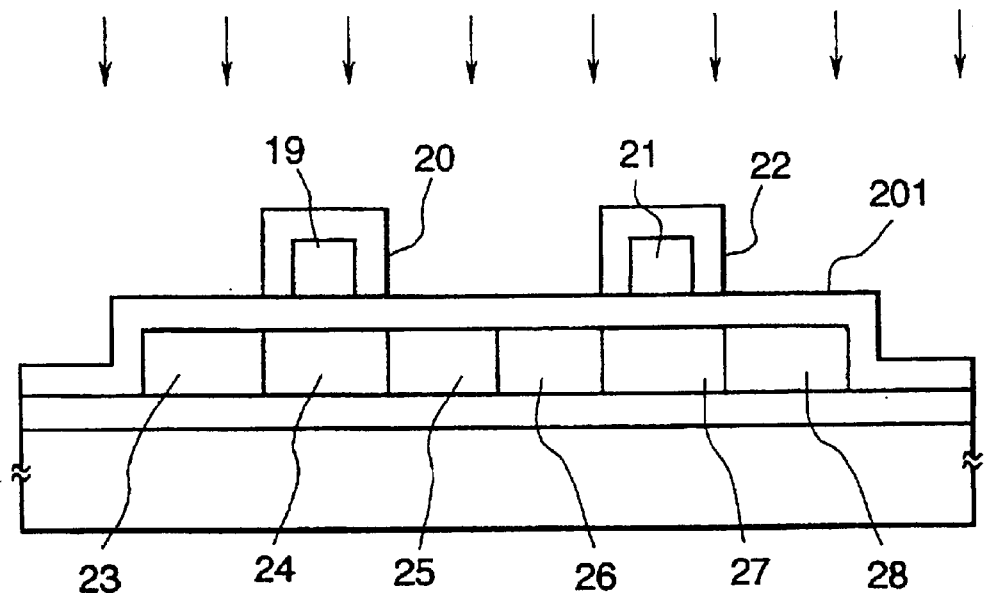
FIGS. 2(A) and 2(B) are cross-sectional views of TFTs illustrating successive steps for fabricating the TFTs according to another embodiment of the invention.
Figure 2:
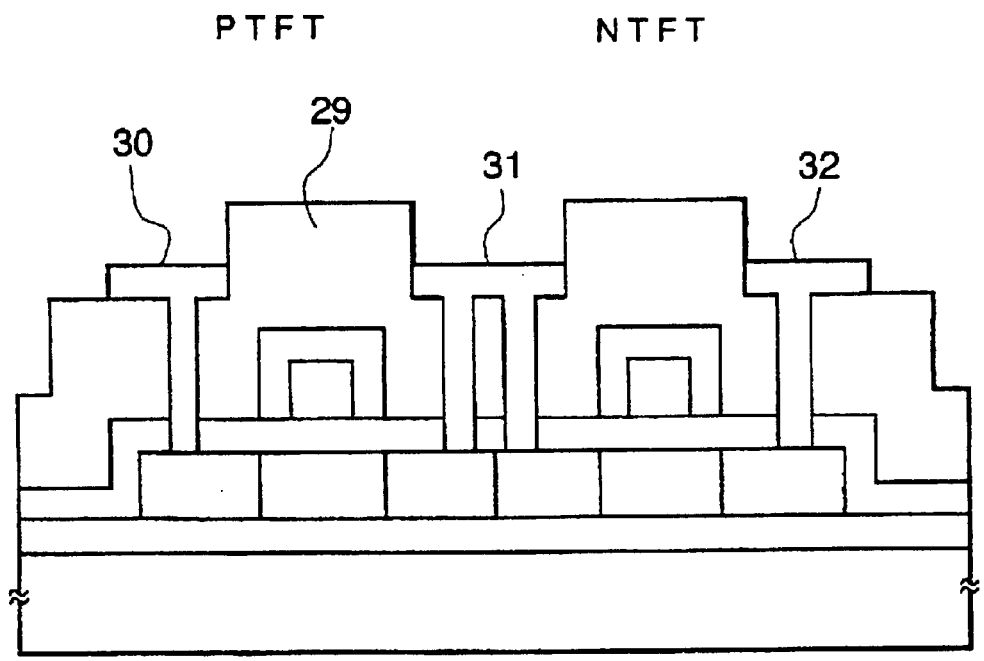

Then, as shown in FIG. 2(A), a silicon oxide film 201 having a thickness of 1000 Å0 was formed as a gate-insulating film by sputtering. During this sputtering step, a target consisting of silicon oxide was used. The substrate temperature was 200 to 400° C., e.g., 350° C. The sputtering ambient consisted of oxygen and argon. The ratio of the amount of the argon to the amount of the oxygen was 0 to 0.5, e.g., less than 0.1.

Subsequently, an aluminum film having a thickness of 6000 to 8000 Å, e.g., 6000 Å, was formed by sputtering. The film contained 0.1 to 2% silicon. The aluminum film was patterned to form gate electrodes 19 and 21. The surfaces of the aluminum electrodes were anodized to form oxide layers 20 and 22 on the surfaces. This anodization was carried out in an ethylene glycol solution containing 1 to 5% tartaric acid. The thickness of the obtained oxide layers 20 and 22 was 2000 Å. The thickness of these oxide layers 20 and 22 determines an offset gate region in a later ion-doping step. Therefore, the length of the offset gate region can be determined in the above-described anodization step.

Then, impurity ions were implanted to impart one conductivity type to an active layer region forming source/drains and a channel. In this ion implantation step, impurities, i.e., phosphorus and boron, were implanted, using the gate electrode 19, its surrounding oxide layer 20, the gate electrode 21, and its surrounding oxide layer 22 as a mask. Phosphine ($PH_3$) and diborane ($B_2H_6$) were used as dopant gases. The phosphine was accelerated at 60 to 90 kV, e.g., 80 kV. The diborane was accelerated at 40 to 80 kV, e.g., 65 kV. The doses were $1 \times 10^{15}$ to $8 \times 10^{15}$ ions/cm$^2$. For example, the dose of the phosphorus was $2 \times 10^{15}$ ions/cm$^2$. The dose of the boron was $5 \times 10^{15}$ ions/cm$^2$. During the doping step, one region was coated with a photoresist to implant the elements selectively. As a result, N-type doped regions 26, 28 and P-type doped regions 23, 25 were formed. Thus, a region for a P-channel TFT (PTFT) and a region for an N-channel TFT (NTFT) could be formed.

Thereafter, the laminate was annealed by irradiation of laser light or other intense light. Laser light emitted by a KrF excimer laser (having a wavelength of 248 nm and a pulse width of 20 nsec) was used. Other laser may also be used. The laser light was emitted at an energy density of 200 to 400 mJ/cm$^2$, e.g., 250 mJ/cm$^2$. Two to 10 shots, e.g., 2 shots, were emitted per location. It was advantageous to heat the substrate to about 200 to 450° C. during the laser irradiation. Since the nickel atoms had been already diffused in the previously crystallized regions, the laser irradiation promoted recrystallization in this laser annealing step. The regions 23 and 25 doped with the impurities for imparting the conductivity type P and the regions 26 and 28 doped with the impurities for imparting conductivity type N could be easily activated.

Where irradiation of intense light other than laser light is used in this step, it is advantageous to use infrared light having wavelength, for example 1.2 μm. Infrared light can be easily absorbed by silicon and permits an effective anneal comparable to thermal annealing conducted above 1000° C. However, infrared light is not readily absorbed by the glass substrate and so the substrate is prevented from being overheated. Furthermore, the processing can be carried out in a short time. In consequence, the use of irradiation of infrared light is best suited for a step where shrinkage of the glass substrate is a problem.

Subsequently, a silicon oxide film 29 having a thickness of 6000 Å was formed as an interlayer insulator by plasma CVD. Contact holes were formed in this silicon oxide film 29. Electrodes of TFTs and conductive interconnects 30, 31, 32 were fabricated from a multilayer film of a metal material, e.g. titanium nitride and aluminum. Finally, the laminate was annealed at 350° C. for 30 minutes in hydrogen atmosphere at 1 atm. In this way, a semiconductor circuit comprising complementary TFTs was completed (FIG. 2(B)).

This circuit is of the CMOS structure comprising complementary PTFT and NTFT. The above-described step may be modified as follows. Two TFTs are fabricated at the same time. The two TFTs are separated into the two independent TFTs.

In this structure, the direction in which the carriers are moved between the source and drain is substantially coincident with the direction in which crystals are grown in the channel formation region. Hence, TFTs of high mobilities can be obtained. That is, the carriers move along the grain boundaries of stylus-like or columnar crystals. The resistance that the carriers receive can be reduced. This enables fabrication of TFTs having high mobilities.

EXAMPLE 2

The present example relates to an active-matrix liquid-crystal display having N-channel TFTs which are used as switching devices for pixels. In the description made below, only one pixel is treated. Other numerous (generally hundreds of thousands of) pixels are constructed similarly. Obviously, the N-channel TFTs may be replaced by P-channel TFTs. The TFTs can be used in a peripheral circuit rather than in pixel portions of the liquid crystal display. Furthermore, the TFTs can be used in an image sensor or other apparatus.

The process sequence of the present example is illustrated in FIGS. 1, (A)–(D), and 3, (A)–(B). The manufacturing steps are carried out in this order. In the present example, a substrate 201 made of Corning 7059 having a thickness of 1.1 mm and measuring 300×400 mm was used. The steps shown in FIG. 1, (A)–(D), are the same as the steps of Example 1 and so these steps are not described below.

Figure 1D:
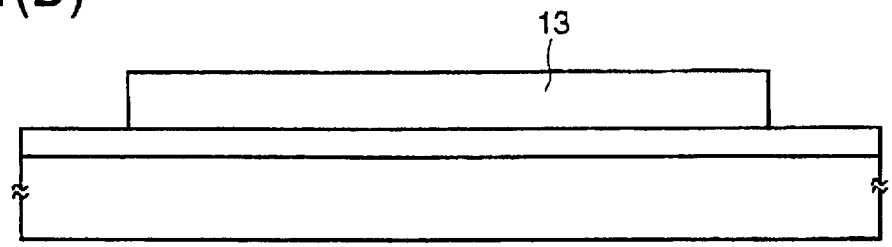
Figure 3:
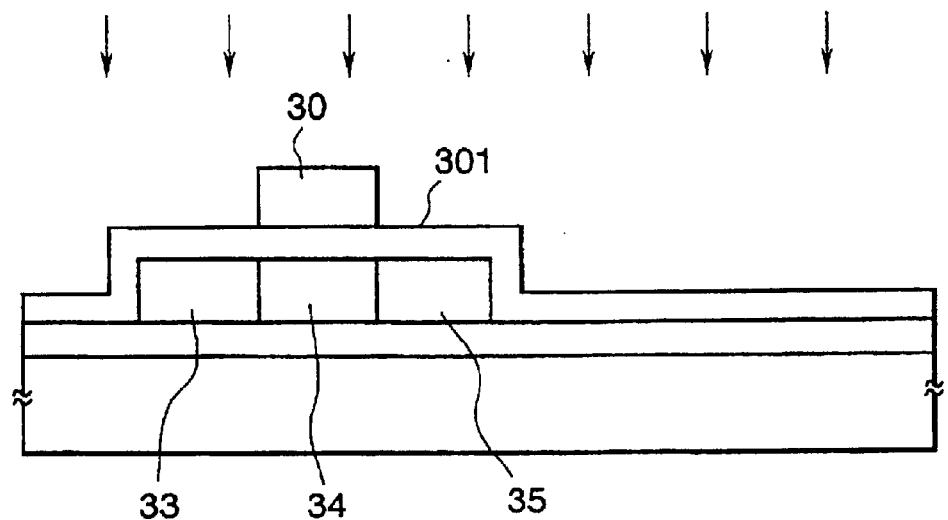
FIGS. 3(A) and 3(B) are cross-sectional views of TFTs illustrating successive steps for fabricating the TFTs according to a further embodiment of the invention.
Figure 3:
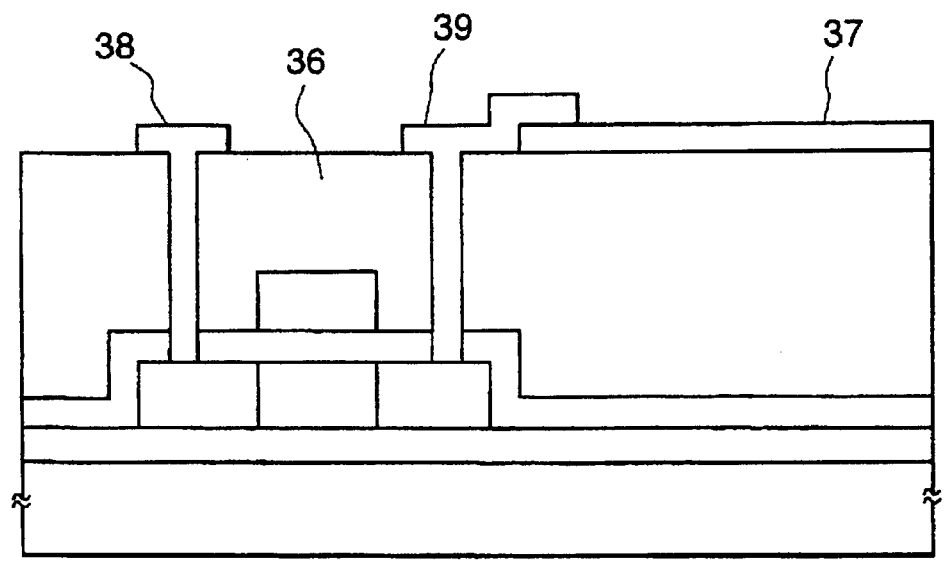
Figure 4:
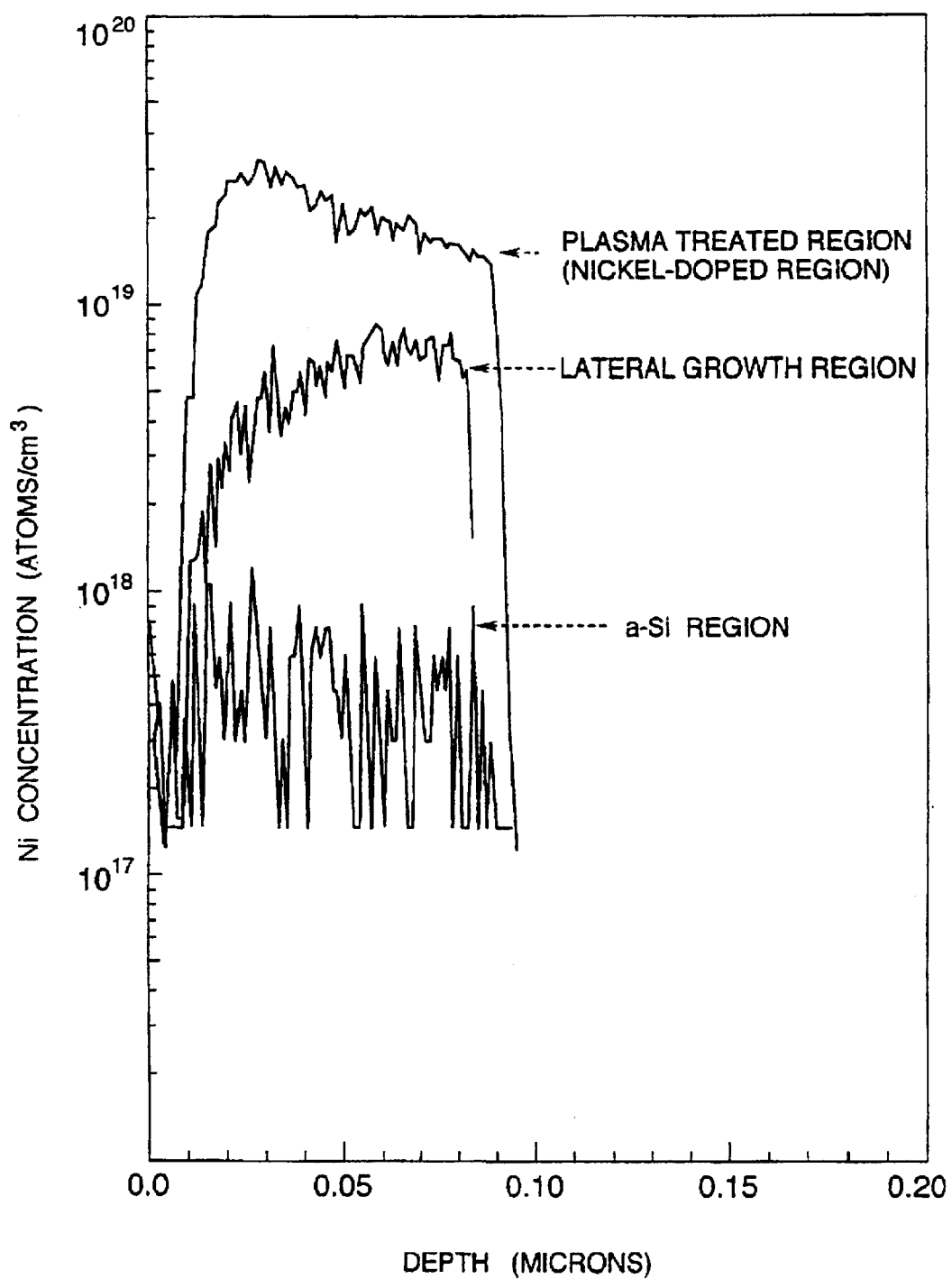
FIG. 4 is a graph showing the nickel concentration in a silicon film.

As shown in FIG. 1(D), after obtaining a crystallized silicon film 13 individual devices were separated by patterning. If the central portion of the silicon film 13 between the individual devices is removed, then the central portion of the silicon film 13 heavily doped with nickel can be removed with desirable results. In this way, as shown in FIG. 3(A), active layer regions (33, 34, and 35 in FIG. 3(A)) were determined. A silicon oxide film 301 becoming a gate-insulating film was formed. This silicon oxide film may be formed by sputtering. In this example, the silicon oxide film was formed out of TEOS within an oxygen ambient by plasma CVD. The thickness of the silicon oxide film was 1000 Å.

Then, a well-known film consisting principally of silicon was formed by CVD and photolithographically patterned to form gate electrodes 32. Phosphorus ions were implanted as N-type impurities by ion implantation. Source regions 33, channel formation regions 34, and drain regions 35 were formed by a self-aligning process. The silicon film was irradiated with laser light or other intense light to improve the crystallinity of the silicon film which was deteriorated due to the ion implantation. At this time, the energy density of the laser light was 250 to 300 mJ/cm$^2$. As a result of the laser irradiation, the sheet resistance of the source/drain regions of the TFTs was changed to 300 to 800 ω/cm$^2$. Where intense light other than laser light is used, it is effective to use lamp annealing using infrared radiation.

Then, an interlayer insulator 36 was formed out of silicon oxide. Pixel electrodes 37 were fabricated out of ITO. Contact holes were formed. Electrodes 38 and 39 were formed on the source/drain regions of the TFTs out of a multilayer film of chromium and aluminum. One electrode 39 was connected also with the ITO electrodes 37. Finally, the laminate was annealed at 200–300° C. for 2 hours within hydrogen, thus completing hydrogenation. In this manner, TFTs were completed. This step was carried out also for other numerous pixel regions simultaneously.

The TFTs fabricated in the present example uses the crystalline silicon film as the active layer forming the source regions, the channel formation regions, and the drain regions. The crystalline silicon film comprises crystals grown in the direction in which carriers flow. Therefore, the carriers do not cross the crystal grain boundaries. That is, the carriers move along the grain boundaries of stylus- or column-like crystals. Consequently, TFTs having high mobilities can be built.

In the step illustrated in FIG. 1(C), the nickel silicide regions are removed. In the steps illustrated in FIG. 1(D) through FIG. 3(A), the active layer is established without containing the central portion 10 of the silicon film 13. In this way, the active layer is not heavily doped with nickel. This can enhance the reliability of the TFTs. That is, nickel silicide is formed at the side surfaces 18. The finally growing crystals meet each other and terminate in the central portion 10 and so this portion is heavily doped with nickel. It is important that this portion be etched away before the TFTs are completed. It is to be understood that the invention is not restricted to TFTs. For example, it is advantageous to fabricate a semiconductor device such as a thin-film diode, using this active layer.

EXAMPLE 3

In the present example, a P-channel TFT (PTFT) and an N-channel TFT (NTFT) using a crystalline silicon film formed on a glass substrate are combined complementarily to build a circuit. The structure of the present example can be applied to switching devices for pixel electrodes of an active-matrix liquid-crystal display, to a peripheral driver circuit thereof, to an image sensor, and to an integrated circuit.

Figure 5:
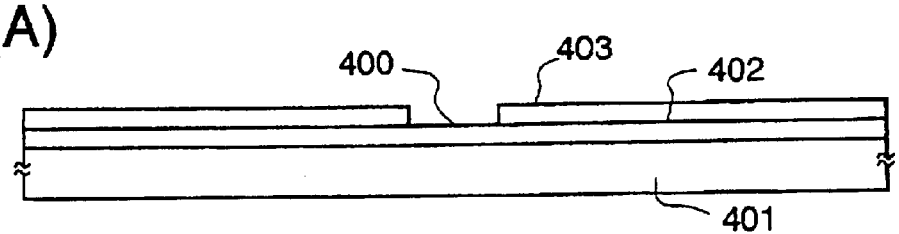
FIGS. 5(A) to 5(D) are cross-sectional views of TFTs illustrating successive steps for fabricating the TFTs according to a still other embodiment of the invention.
Figure 5:
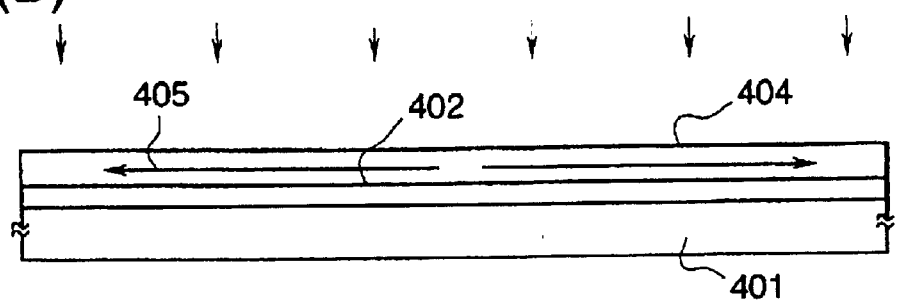
Figure 5:
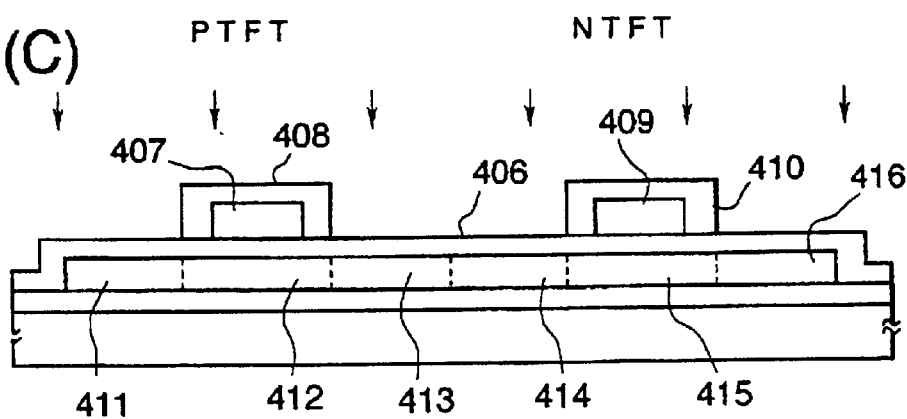
Figure 5:
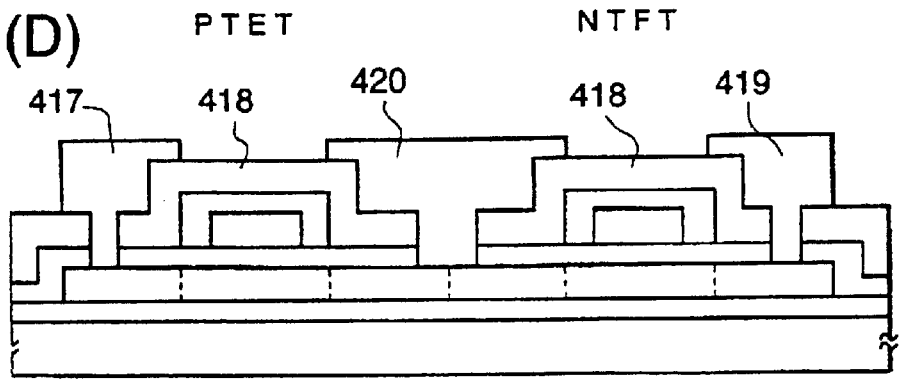

The process sequence of the present example is schematically shown in FIGS. 5, (A)–(D). First, silicon oxide was sputtered as a bottom film 402 having a thickness of 2000 Å on a substrate 401 made of Corning 7059. Then, a mask 403 made of a metal, silicon oxide, or the like was formed. This mask 403 permits the bottom film 402 to be exposed like a slit. That is, when the state shown in FIG. 5(A) was viewed from above, the slit-like portion of the bottom film 402 was exposed; the other portions were masked. After forming the mask 403, a nickel silicide film having a thickness of 5 to 200 Å, e.g., 20 Å, was selectively formed on a region 400 by sputtering. The composition of the nickel silicide is given by a chemical formula $NiSi_x$, where $0.4 \leq x \leq 2.5$ (e.g., x=2.0). Under this condition, nickel atoms were selectively implanted into the region 400.

Then, the mask 403 was removed. An intrinsic (I-type) amorphous silicon film (non-single crystal silicon film) 404 having a thickness of 500 to 1500 Å, e.g., 1000 Å, was formed by plasma CVD. This was irradiated with infrared light having a peak at a wavelength of 0.5 to 5 μm (in this example, 1 to 1.5 μm) for several seconds to several minutes to change the amorphous silicon film on the region 400 into nickel silicide. This step is effective in diffusing nickel atoms through the silicon film. Instead of the infrared light, laser light can be used.

The laminate was annealed at 550° C. for 4 hours in a reducing hydrogen ambient (preferably, the partial pressure of the hydrogen is 0.1 to 1 atm) or in an inert ambient (at atmospheric pressure) to crystallize the amorphous film. At this time, a nickel silicide film was selectively formed on the region 400. In this region 400, the crystalline silicon film 404 was crystallized vertical to the substrate 401. In the regions other than the region 400, crystals were grown laterally from the region 400, i.e., parallel to the substrate, as indicated by the arrows 405.

After this step, the laminate was annealed by irradiation of the aforementioned infrared light. This further promoted the crystallization of the silicon film 404. During the annealing, a silicon nitride film acting as a protective film was preferably formed on the surface because this improved the state of the surface of the silicon film 404. This state of the surface of the silicon film 404 may also be improved effectively by performing this anneal within an ambient of $H_2$ or HCl. Instead of the infrared light, laser radiation may be used.

Since this anneal selectively heats the silicon film, the amount of heat applied to the glass substrate can be suppressed to a minimum. Also, defects and dangling bonds in the silicon film can be reduced very effectively.

It is important to perform the anneal using the infrared light or laser light after the crystallization step. Where the amorphous silicon film is annealed by infrared light or laser light without thermally crystallizing the film, a crystalline silicon film having large grain diameters on the order of micrometers can be obtained. However, the crystals have clear grain boundaries which are not adapted for use in devices. For example, some clear grain boundaries exist within the channel formation regions. This impedes movement of the carriers with undesirable results.

On the other hand, if crystals are grown parallel to the substrate by thermal crystallization as described above, and if the silicon film composed of these crystals is annealed by infrared light or laser light, then the crystalline structure consisting of crystals grown like styli or columns parallel to the substrate can be made denser. This further promotes crystal growth having one-dimensional anisotropy in one direction. Movement of the carriers in this direction is hardly affected by the crystal grain boundaries.

As a result of the above-described step, the amorphous silicon film was crystallized and the crystalline silicon film 404 could be obtained. Thereafter, the individual devices were separated. The active layer regions of TFTs were established. At this time, it is important that the front ends 105 of growing crystals do not exist in the portions becoming the channel formation regions 405. This prevents the carriers moving between the source and drain from being affected by nickel in the channel formation regions.

Then, a silicon oxide film 406 having a thickness of 1000 Å was formed as a gate-insulating film by sputtering techniques. During this sputtering process, a target consisting of silicon oxide was used. The substrate temperature was 200 to 400° C., e.g., 350° C. The sputtering ambient consisted of oxygen and argon. The ratio of the amount of the argon to the amount of the oxygen was 0 to 0.5, e.g., less than 0.1.

After the formation of the silicon oxide film 406 becoming the gate-insulating film, an anneal was carried out again by irradiation of infrared light or laser light. This anneal could annihilate mainly levels in the interface between the silicon oxide film 406 and the silicon film 404 and levels in portions close to the interface. This is quite useful for an insulated-gated field-effect transistor where the characteristics of the interface between the gate-insulating film and the channel formation region are quite important.

Subsequently, an aluminum film having a thickness of 6000 to 8000 Å, e.g., 6000 Å, was formed by sputtering. The film contained 0.1 to 2% silicon. The aluminum film was patterned to form gate electrodes 407 and 409. The surfaces of the aluminum electrodes were anodized to form oxide layers 408 and 410 on the surfaces. This anodization step was carried out in an ethylene glycol solution containing 1 to 5% tartaric acid. The thickness of the obtained oxide layers 408 and 410 was 2000 Å. The thickness of these oxide layers 408 and 410 determines an offset gate region in a later ion-doping step. Therefore, the length of the offset gate region can be determined in the above-described anodization step.

Then, impurity ions were implanted to impart one conductivity type to active layer regions which formed source/drains and channels. In this ion implantation step, impurities, i.e., phosphorus and boron, were implanted, using the gate electrode 407, its surrounding oxide layer 408, the gate electrode 409, and its surrounding oxide layer 410 as a mask. Phosphine ($PH_3$) and diborane ($B_2H_6$) were used as dopant gases. The phosphine was accelerated at 60 to 90 kV, e.g., 80 kV. The diborane was accelerated at 40 to 80 kV, e.g., 65 kV. The doses were $1 \times 10^{15}$ to $8 \times 10^{15}$ ions/cm². For example, the dose of the phosphorus was $2 \times 10^{15}$ ions/cm². The dose of the boron was $5 \times 10^{15}$ ions/cm². During the doping step, one region was coated with a photoresist to implant the elements selectively. As a result, N-type doped regions 414, 416 and P-type doped regions 411, 413 were formed. Thus, a region for a P-channel TFT (PTFT) and a region for an N-channel TFT (NTFT) could be formed.

Thereafter, the laminate was annealed by irradiation of laser light. Laser light emitted by a KrF excimer laser (having a wavelength of 248 nm and a pulse width of 20 nsec) was used. Other laser may also be used. The laser light was emitted at an energy density of 200 to 400 mJ/cm$^2$, e.g., 250 mJ/cm$^2$. Two to 10 shots, e.g., 2 shots, were emitted per location. It was advantageous to heat the substrate to about 200 to 450° C. during the laser irradiation. Since the nickel atoms were diffused into the previously crystallized regions, the laser irradiation promoted recrystallization in this laser annealing step. The regions 411 and 413 doped with the impurities for imparting the conductivity type P and the regions 414 and 416 doped with the impurities for imparting conductivity type N could be easily activated.

This step can also utilize lamp annealing using infrared light. Infrared light can be easily absorbed into silicon and permits an effective anneal comparable to thermal annealing conducted above 1000° C. However, infrared light is not readily absorbed by the glass substrate and so the substrate is prevented from being overheated. Furthermore, the processing can be carried out in a short time. In consequence, the use of irradiation of infrared light is best suited for a step where shrinkage of the glass substrate is a problem.

Subsequently, a silicon oxide film 418 having a thickness of 6000 Å was formed as an interlayer insulator by plasma CVD. The interlayer insulator may be made of polyimide. Contact holes were formed in this silicon oxide film 418. Electrodes of TFTs and conductive interconnects 417, 420, 419 were fabricated from a multilayer film of a metal material, e.g. titanium nitride and aluminum. Finally, the laminate was annealed at 350° C. for 30 minutes in a hydrogen atmosphere at 1 atm. In this way, a semiconductor circuit comprising complementary TFTs was completed (FIG. 5(D)).

This circuit is of the CMOS structure comprising complementary PTFT and NTFT. The above-described step may be modified as follows. Two TFTs are fabricated at the same time. The two TFTs are separated into the two independent TFTs.

Figure 6:
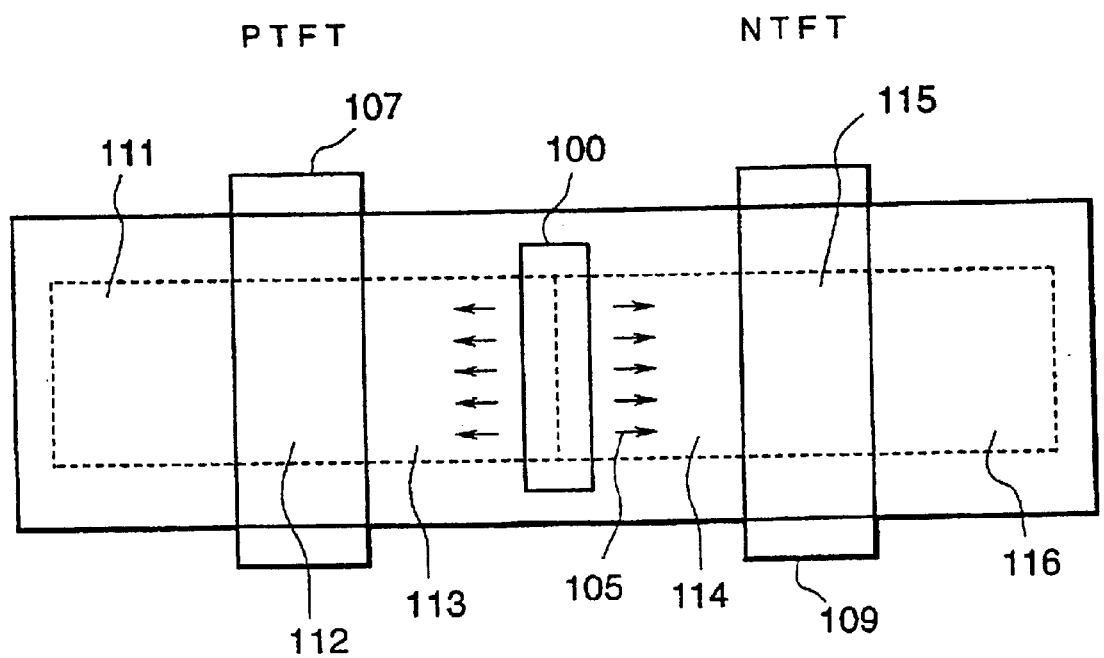
FIG. 6 is a schematic diagram of TFTs according to the invention.

FIG. 6 is a schematic top view of the structure shown in FIG. 5(D). It is to be noted that like components are indicated by like reference numerals in FIGS. 5, (A)–(D), and 6. As shown in FIG. 6, crystallization progresses in the direction indicated by the arrows. Crystals are grown along the lines connecting the source and drain regions. During the operation of the TFTs of this structure, carriers move between the source and drain along the crystals grown like styli or columns. In particular, the carriers move along the grain boundaries of the stylus- or column-like crystals. The resistance that the carriers receive can be reduced. This enables fabrication of TFTs having high mobilities.

In the present example, Ni atoms are introduced by forming a Ni thin film selectively on the bottom layer 402 located under the amorphous silicon film 404 and starting growth of crystals from this thin film. Since this Ni film is so thin that it is difficult to observe it as a film. After the formation of the amorphous silicon film 404, a nickel silicide film may be selectively formed. That is, the crystal growth may be started either from the top surface or from the bottom surface of the amorphous silicon film. Another available method consists of depositing an amorphous silicon film and then implanting nickel ions into selected portions of this amorphous silicon film 404 by ion doping. This method is characterized in that the concentration of the nickel element can be controlled. Furthermore, plasma processing or CVD may be employed.

EXAMPLE 4

The present example is an active-matrix liquid-crystal display having N-channel TFTs which are arranged as switching devices for pixels. In the description made below, only one pixel is treated but other numerous (generally hundreds of thousands of) pixels are constructed similarly. Obviously, the N-channel TFTs may be replaced by P-channel TFTs. The TFTs can be used in a peripheral circuit rather than in pixels of the liquid crystal display. Furthermore, the TFTs can be used in an image sensor or other apparatus. That is, no limitations are imposed on the application as long as TFTs are used.

Figure 7:
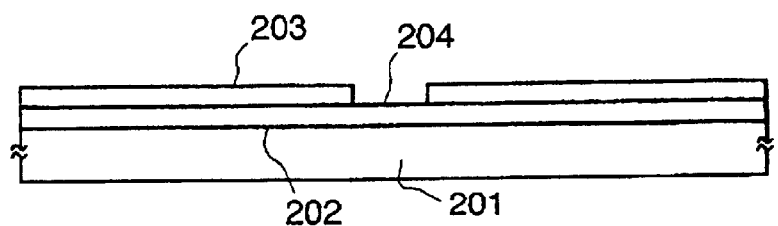
FIGS. 7(A) to 7(D) are cross-sectional views of TFTs illustrating successive steps for fabricating the TFTs according to a yet other embodiment of the invention.
Figure 7:
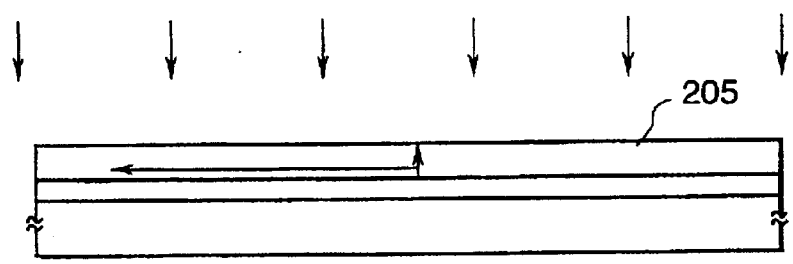
Figure 7:
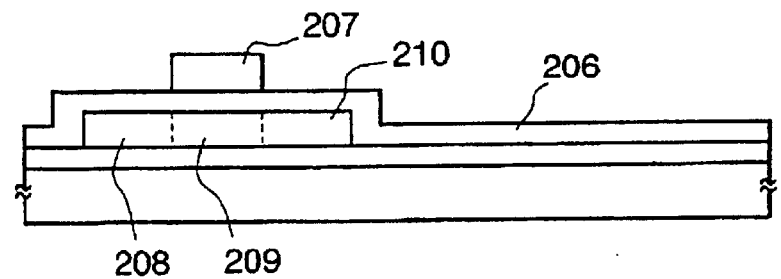
Figure 7D:
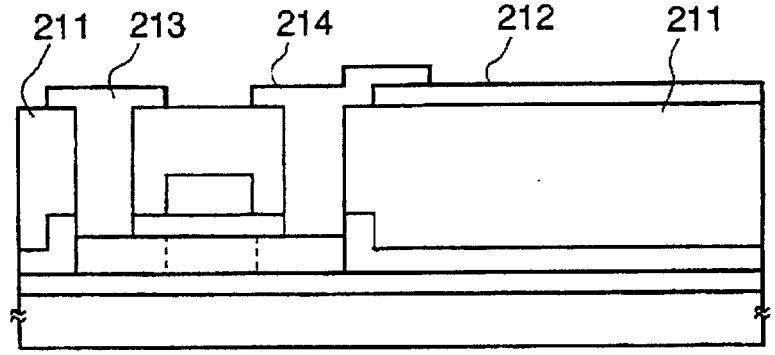

An insulated-gate field-effect transistor is fabricated as follows. The process sequence of the present example is schematically shown in FIGS. 7, (A)–(D). In the present example, a glass substrate 201 made of Corning 7059 having a thickness of 1.1 mm and measuring 300×400 mm was used. First, silicon oxide was sputtered as a bottom film 202 having a thickness of 2000 Å. Then, a mask 203 was formed out of a metal, silicon oxide, a photoresist, or other material. A nickel silicide film was formed by sputtering to a thickness of 5 to 200 Å, e.g., 20 Å. The composition of the nickel suicide is given by a chemical formula NiSi$_x$, where $0.4 \leq x \leq 2.5$ (e.g., x=2.0). In this way, the nickel silicide film was selectively formed on a region 204.

Then, an amorphous silicon film 205 having a thickness of 1000 Å was formed by LPCVD or plasma CVD. Thereafter, the film was annealed by irradiation of infrared radiation or laser light to form a silicide between the nickel contained in the nickel silicide film and the amorphous silicon film 205. This step was also intended to effectively diffuse nickel atoms into the amorphous silicon film. The laminate was dehydrogenated at 400° C. for 1 hour. Then, the amorphous film was crystallized by thermal annealing. This annealing step was carried out at 550° C. for 4 hours in a reducing hydrogen ambient (preferably, the partial pressure of the hydrogen is 0.1 to 1 atm). This thermal anneal may also be carried out in an ambient of an inert gas such as nitrogen.

In this annealing step, the nickel silicide film was formed on the region 204 located under the amorphous silicon film 205. Therefore, crystallization started from this region. During this crystallization, as indicated by one arrow in FIG. 7(B), silicon crystals grew vertical to the substrate 201 in the region 204 on which the nickel silicide was deposited. As indicated by another arrow, crystal grew parallel to the substrate in regions (i.e., other than the region 204) on which nickel silicide was not deposited.

After this heating step, the mask 103 was removed. The silicon film 205 was again thermally annealed by irradiation of infrared light or laser light. In this way, a semiconductor film 205 consisting of crystalline silicon could be obtained. Then, the semiconductor film 205 was photolithographically patterned to form semiconductor island regions, or the active layers of TFTs. It is important that the front ends of crystals grown as indicated by the arrows do not exist in the active layers, especially in the channel formation regions. Specifically, where the front ends of the arrows in FIG. 7(B) indicate the ends of growing crystals, a nickel-doped region 204 and the crystalline silicon film 205 at the end (i.e., the left end of the figure) of the horizontal arrow were etched away. It is advantageous to use the intermediate crystal portions which have grown parallel to the crystalline silicon film 205 as the active layers. This prevents the characteristics of the TFTs from being adversely affected by the nickel atoms concentrated at the front ends of the grown crystals.

Then, a gate-insulating film 206 having a thickness of 70 to 120 nm, typically 100 nm, was formed out of TEOS in an oxygen ambient by plasma CVD. The substrate temperature was set lower than 400° C., preferably 200–350° C., to prevent the glass substrate from shrinking or warping.

Subsequently, the laminate was heated again by irradiation of infrared light or laser light to improve the characteristics of the interface between the silicon film 205 and the silicon oxide film 206. Then, a well-known film consisting mainly of silicon was formed by CVD and photolithographically patterned to form gate electrodes 207. Subsequently, phosphorus ions were implanted as N-type impurities by ion implantation. Source regions 208, channel formation regions 209, and drain regions 210 were formed by a self-aligning process. The silicon film was irradiated with laser light emitted by a KrF laser to improve the crystallinity of the silicon film which was deteriorated by the ion implantation. At this time, the energy density of the laser light was 250 to 300 mJ/cm$^2$. As a result of the laser irradiation, the sheet resistance of the source/drain regions of the TFTs was changed to 300 to 800 ω/cm$^2$. It is advantageous to use lamp annealing utilizing infrared light in this step.

In the present example, the gate electrode 207 consists principally of silicon and so the film of the gate electrode can be made firmer by the above-described ion implantation and the subsequent annealing.

Then, an interlayer insulator 211 was formed out of silicon oxide or polyimide. Pixel electrodes 212 were fabricated from ITO. Contact holes were formed. Electrodes 213 and 214 were formed on the source/drain regions of the TFTs out of a multilayer film of chromium and aluminum. One electrode 214 was connected also with the ITO electrodes 212. Finally, the laminate was annealed at 200–300° C. for 2 hours within hydrogen, thus completing hydrogenation of the silicon. In this manner, TFTs were completed. This step was carried out also for other numerous pixel regions simultaneously.

The TFTs used in the present example uses a crystalline silicon film acting as the active layers forming source regions, channel formation regions, and drain regions, the crystalline silicon film comprising crystals grown in the direction of flow of carriers. Therefore, the carriers do not cross the grain boundaries of the crystals. The carriers move along the grain boundaries of the stylus- or column-like crystals. This enables fabrication of TFTs having high mobilities. The TFTs fabricated in the present example was of the N-channel type and had mobilities of 90–130 cm$^2$/V·s, which is far superior to the mobilities of 80 to 100 cm$^2$/V·s of the conventional N-channel TFTs using a crystalline silicon film obtained by crystallization caused by thermal annealing conducted at 600° C. for 48 hours. Where the anneal using irradiation of infrared light or laser light during the crystallization step and the anneal using irradiation of infrared light or laser light subsequent to the formation of the gate-insulating film were omitted, the resulting TFTs generally had low mobilities and low ON/OFF current ratios.

EXAMPLE 5

The present example is an extension of the structure of Example 3. TFTs are fabricated, using only regions lightly doped with a metal which promotes crystallization. FIGS. 8, (A)–(E), illustrate the process sequence of the present example. It is to be noted that like components are indicated by like reference numerals in FIGS. 5, (A)–(D), 8, (A)–(E). First, a bottom film 402 was formed on a glass substrate 401. A nickel silicide film was formed on a region 400, using a mask 403, in the same way as in Example 3. After implanting nickel atoms into the region 400 in this way, annealing using infrared light or laser light was carried out, followed by removal of the mask 403. Subsequently, the amorphous silicon film 404 was formed. The amorphous film was annealed at 550° C. for 4 hours to crystallize the silicon film 404. As indicated by the arrows 405, crystal grew parallel to the substrate. After the thermal annealing, an anneal was again effected, using irradiation of infrared light or laser light to promote the crystallization further.

Figure 8A:
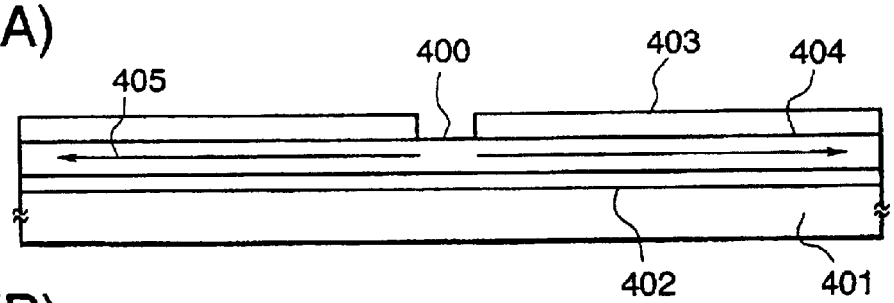
FIGS. 8(A) to 8(E) are cross-sectional views of TFTs illustrating successive steps for fabricating the TFTs according to a yet further embodiment of the invention.
Figure 8B:
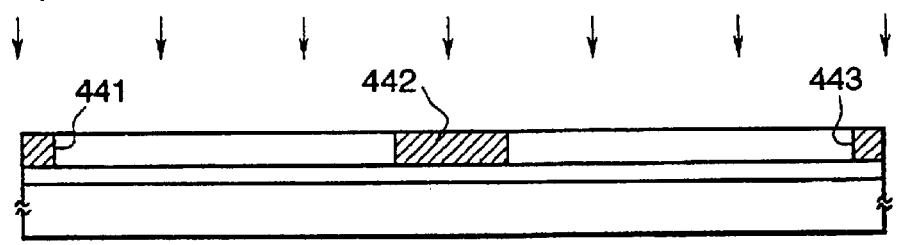

In this way, the state shown in FIG. 8(B) was realized. In this state, nickel atoms were directly introduced in a region 442. That is, this region 442 was heavily doped with nickel. The growth of the crystals ended in regions 441 and 443. These regions 441 and 443 were also heavily doped with nickel. We have found that the nickel concentration in these regions is higher than the nickel concentration in the intervening crystallized regions almost by one order of magnitude.

Figure 8C:
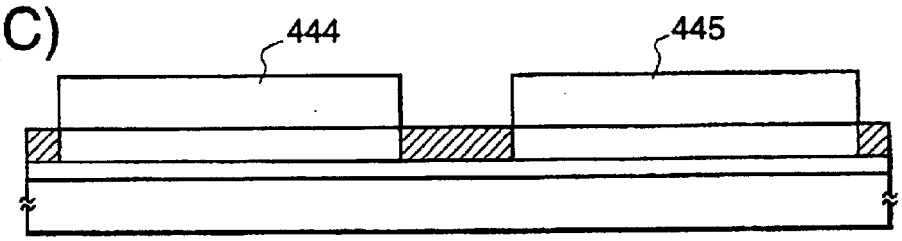
Figure 8D:
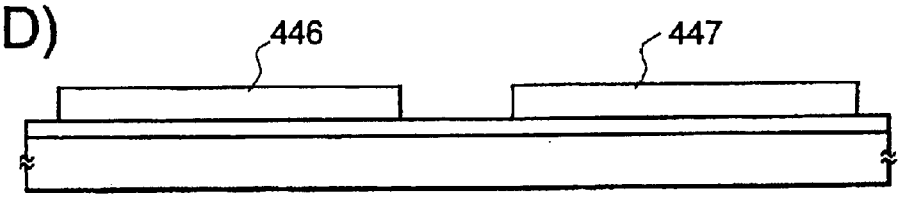

The present example is characterized in that this region heavily doped with nickel is not used. As shown in FIG. 8(C), a mask was formed out of a resist at 444 and 445. Regions 441, 442, and 443 were etched away. This etching process was carried out by RIE having vertical anisotropy.

After the etching, the mask, 444 and 445, was removed. Thus, the shape shown in FIG. 8(D) was obtained. Under this condition, crystals grew parallel to the substrate 401. In addition, crystalline silicon films 446 and 447 relatively lightly doped with nickel could be obtained. These crystalline silicon films 446 and 447 act as the active layers of TFTs, or thin-film semiconductors forming thin-film diodes or the like. Therefore, these crystalline silicon films are oriented. The nickel concentration in the films is about $10^{17}$ to $10^{19}$ atoms/cm$^3$.

Figure 8E:
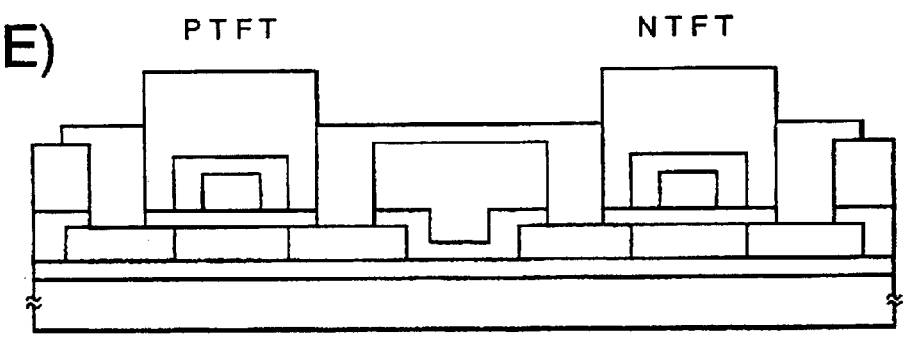
Figure 9:
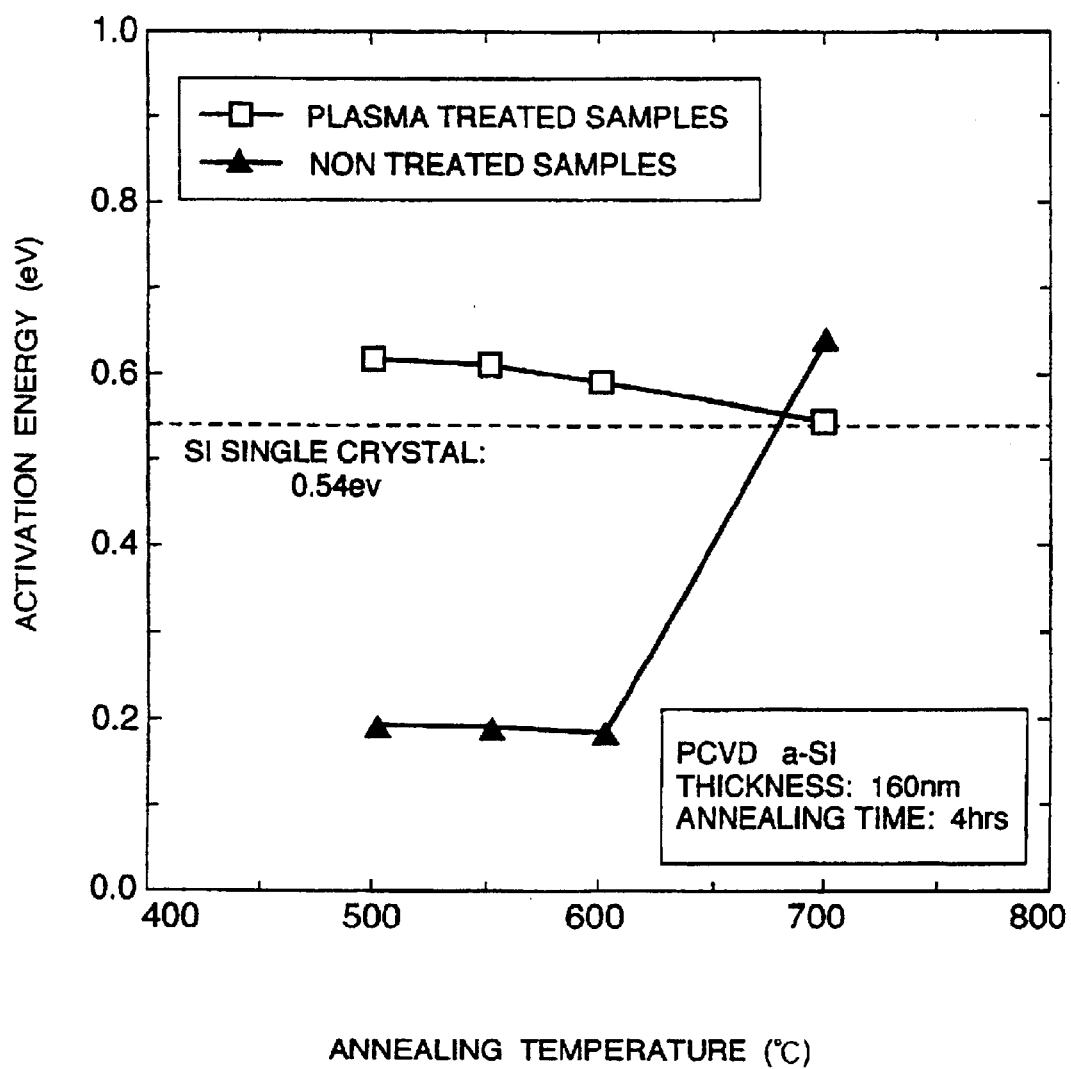
FIG. 9 shows a relation between the activation energy and the annealing temperature.
Figure 10:
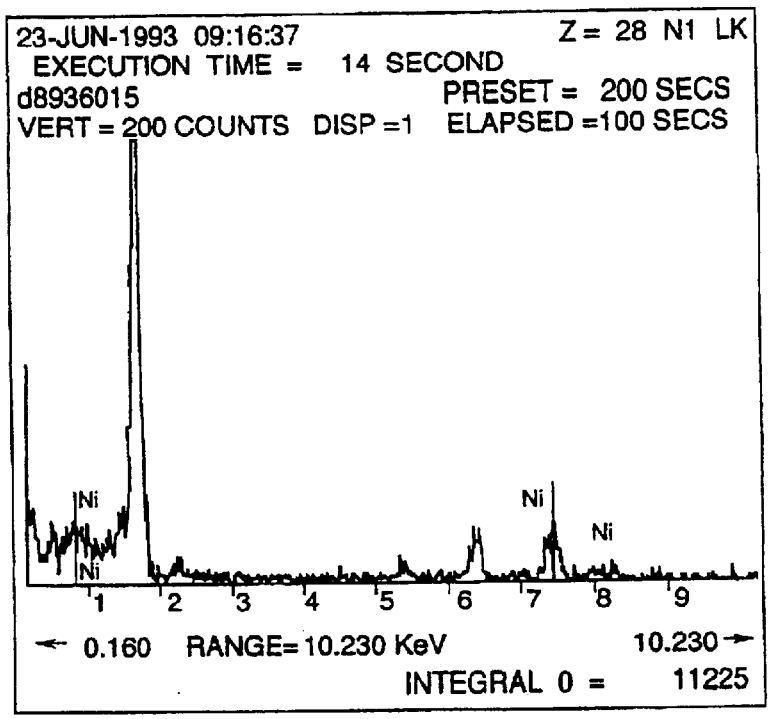
FIGS. 10(A) and 10(B) show EDX results.
Figure 10:
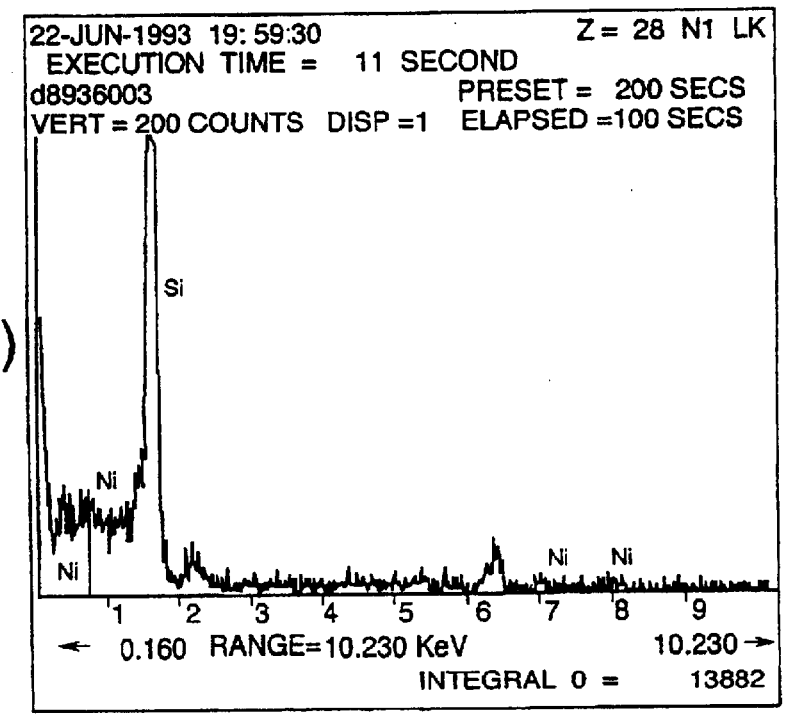

In the present example, the silicon films 446 and 447 are used as the active layers of TFTs. A complementary TFT circuit is composed of these TFTs. The structure of this circuit is shown in FIG. 8(E) and similar to the structure shown in FIG. 5(D) except that in the structure shown in FIG. 5(D), the active layers of two TFTs are continuous with each other and the nickel concentration is high in the intermediate region.

Where the structure shown in FIG. 8(E) is adopted, the active layers are not heavily doped with nickel. This enhances the stability of the operation.

In the present example, it is quite advantageous to effect an anneal using irradiation of infrared light or laser light after the formation of the gate-insulating film so as to improve the characteristics of the interface between the gate-insulating film and the active layers 446 and 447.

An amorphous silicon film is photolithographically patterned into islands. A film of a metal element for promoting crystallization is deposited on the side surfaces of the amorphous silicon film. In this way, it is possible to make the whole amorphous silicon film a silicon film consisting of crystals grown parallel to the substrate. After removing this metal element film, TFTs are built, using the crystallized silicon film. As a result, TFTs having high mobilities can be derived.

A crystalline silicon film is crystallized by heating. Subsequently, the silicon film is annealed by irradiation of infrared light or laser light. This promotes crystallization and makes the film denser. In consequence, a silicon film having good crystallinity can be obtained. Furthermore, the interface levels can be reduced by conducting an anneal by irradiation of infrared light or laser light after an insulating film is formed on a silicon film. Especially, where an insulated-gated field-effect transistor is fabricated, great advantages can be had.

What is claimed is:

1. A method of manufacturing a display device comprising the steps of:
   forming a semiconductor film comprising amorphous silicon over a substrate;
   providing said semiconductor film with a crystallization promoting material;
   crystallizing said semiconductor film provided with said crystallization promoting material by heating;
   irradiating said crystallized semiconductor film with a light comprising an infrared light to further crystallize said crystallized semiconductor film;
   etching said crystallized semiconductor film into semiconductor layers after said irradiating step;
   introducing an impurity element into selected portions of said semiconductor layers; and
   activating said impurity element in said selected portions of said semiconductor layers.

2. The method of claim 1 wherein said crystallization promoting material comprises a material selected from the group consisting of Fe, Co, Ni, Ru, Rh, Pd, Os, Ir, Pt, Sc, Ti V, Cr, Mn, Cu, Zn, Au and Ag.

3. The method of claim 1 further comprising a step of forming a gate electrode adjacent to said semiconductor layer with a gate insulating film interposed therebetween.

4. The method of claim 1 wherein said display device is a liquid crystal display device.

5. The method of claim 1 wherein said light is irradiated by a lamp.

6. The method of claim 1 wherein said light has a wavelength of 1.2 $\mu$m.

7. The method of claim 1 wherein said activating step is performed by irradiating said crystallized semiconductor film with a laser light.

8. A method of manufacturing a display device comprising the steps of:
   forming a semiconductor film comprising amorphous silicon over a substrate;
   providing said semiconductor film with a crystallization promoting material;
   crystallizing said semiconductor film provided with said crystallization promoting material by heating;
   irradiating said crystallized semiconductor film with a light comprising an infrared light to further crystallize said crystallized semiconductor film;
   etching said crystallized semiconductor film into semiconductor layers after said crystallizing step;
   forming gate electrodes adjacent to said semiconductor layers with a gate insulating film interposed therebetween;
   introducing an impurity element into selected portions of said semiconductor layers using said gate electrodes as a mask; and
   activating said impurity element in said selected portions of said semiconductor layers.

9. The method of claim 8 wherein said crystallization promoting material comprises a material selected from the group consisting of Fe, Co, Ni, Ru, Rh, Pd, Os, Ir, Pt, Sc, Ti V, Cr, Mn, Cu, Zn, Au and Ag.

10. The method of claim 8 wherein said display device is a liquid crystal display device.

11. The method of claim 8 wherein said gate insulating film is formed by CVD using an organic silane gas.

12. The method of claim 8 wherein said light is irradiated by a lamp.

13. The method of claim 8 wherein said light has a wavelength of 1.2 $\mu$m.

14. The method of claim 8 wherein said activating step is performed by irradiating said crystallized semiconductor film with a laser light.

15. A method of manufacturing a display device comprising the steps of:
   forming a semiconductor film comprising amorphous silicon over a substrate;
   providing said semiconductor film with a crystallization promoting material;
   crystallizing said semiconductor film provided with said crystallization promoting material, whereby a semiconductor film having a first crystallinity is obtained;
   irradiating said semiconductor film with a light after said crystallizing step, whereby a semiconductor film having a second crystallinity is obtained,
      wherein said second crystallinity is more enhanced than said first crystallinity;
   etching said semiconductor film into semiconductor layers after said irradiating step;
   introducing an impurity element into selected portions of said semiconductor layers; and
   activating said impurity element in said selected portions of said semiconductor layers.

16. The method of claim 15 wherein said crystallization promoting material comprises a material selected from the group consisting of Fe, Co, Ni, Ru, Rh, Pd, Os, Ir, Pt, Sc, Ti V, Cr, Mn, Cu, Zn, Au and Ag.

17. The method of claim 15 wherein said display device is a liquid crystal display device.

18. The method of claim 15 wherein said activating step is performed by irradiating said crystallized semiconductor film with a laser light.

19. A method of manufacturing a display device comprising the steps of:
   forming a semiconductor film comprising amorphous silicon over a substrate;
   providing said semiconductor film with a crystallization promoting material;
   crystallizing said semiconductor film provided with said crystallization promoting material, whereby a semiconductor film having a first crystallinity is obtained;
   irradiating said semiconductor film with a light from a lamp after said crystallizing step, whereby a semiconductor film having a second crystallinity is obtained,
      wherein said second crystallinity is more enhanced than said first crystallinity;
   etching said semiconductor film into semiconductor layers after said irradiating step;
   introducing an impurity element into selected portions of said semiconductor layers; and
   activating said impurity element in said selected portions of said semiconductor layers.

20. The method of claim 19 wherein said crystallization promoting material comprises a material selected from the group consisting of Fe, Co, Ni, Ru, Rh, Pd, Os, Ir, Pt, Sc, Ti V, Cr, Mn, Cu, Zn, Au and Ag.

21. The method of claim 19 wherein said display device is a liquid crystal display device.

22. The method of claim 19 wherein said activating step is performed by irradiating said crystallized semiconductor film with a laser light.

23. A method of manufacturing a display device comprising the steps of:
- forming a semiconductor film comprising amorphous silicon over a substrate;
- providing said semiconductor film with a crystallization promoting material;
- crystallizing said semiconductor film provided with said crystallization promoting material, whereby a semiconductor film having a first crystallinity is obtained;
- irradiating said semiconductor film with an infrared light after said crystallizing step, whereby a semiconductor film having a second crystallinity is obtained,
    - wherein said second crystallinity is more enhanced than said first crystallinity;
- etching said semiconductor film into semiconductor layers after said irradiating step;
- introducing an impurity element into selected portions of said semiconductor layers; and
- activating said impurity element in said selected portions of said semiconductor layers.

24. The method of claim 23 wherein said crystallization promoting material comprises a material selected from the group consisting of Fe, Co, Ni, Ru, Rh, Pd, Os, Ir, Pt, Sc, Ti V, Cr, Mn, Cu, Zn, Au and Ag.

25. The method of claim 23 wherein said display device is a liquid crystal display device.

26. The method of claim 23 wherein said activating step is performed by irradiating said crystallized semiconductor film with a laser light.

* * * * *